(12) United States Patent
Nakae et al.

(10) Patent No.: US 7,245,643 B2
(45) Date of Patent: Jul. 17, 2007

(54) SEMICONDUCTOR LASER MODULE AND METHOD OF MANUFACTURING THE SAME

(75) Inventors: Masashi Nakae, Tokyo (JP); Toshio Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 413 days.

(21) Appl. No.: 10/747,398

(22) Filed: Dec. 30, 2003

(65) Prior Publication Data

US 2004/0213305 A1 Oct. 28, 2004

Related U.S. Application Data

(63) Continuation of application No. PCT/JP02/06679, filed on Jul. 2, 2002.

(30) Foreign Application Priority Data

| Jul. 2, 2001 | (JP) | ............................. 2001-201513 |
| Jul. 17, 2001 | (JP) | ............................. 2001-217266 |
| Oct. 23, 2001 | (JP) | ............................. 2001-325707 |
| Apr. 4, 2002 | (JP) | ............................. 2002-102479 |
| May 20, 2002 | (JP) | ............................. 2002-145422 |

(51) Int. Cl.
*H01S 5/00* (2006.01)
(52) U.S. Cl. ...................... 372/43.01; 372/54; 372/107
(58) Field of Classification Search ............. 372/43.01, 372/54, 107
See application file for complete search history.

(56) References Cited

U.S. PATENT DOCUMENTS

| 4,805,977 A | 2/1989 | Tamura et al. |
| 5,692,082 A | 11/1997 | Fukushima |
| 6,362,919 B1* | 3/2002 | Flanders ...................... 359/497 |
| 2003/0007534 A1* | 1/2003 | Kanemaru et al. ............ 372/50 |

FOREIGN PATENT DOCUMENTS

| EP | 312652 A1 | 4/1989 |
| EP | 1 085 622 A1 | 3/2001 |
| JP | 60-76707 | 5/1985 |
| JP | 63-115145 | 5/1988 |
| JP | 1-291480 | 11/1989 |
| JP | 3-135511 | 6/1991 |

(Continued)

OTHER PUBLICATIONS

Yoshihiro Emori et al., "Koshutsuryoku Reiki Kogen(HPU) no Kaihatsu to Kotaiiki Raman Zofukuki eno Oyo", Furukawa Denko Giho, No. 105 (Jan. 2000), pp. 42-45, published in Japan.

(Continued)

*Primary Examiner*—Dung T. Nguyen
(74) *Attorney, Agent, or Firm*—Oblon, Spivak, McClelland, Maier & Neustadt, P.C.

(57) ABSTRACT

A semiconductor laser module according to the present invention includes a polarization-synthesizing module having a polarization-synthesizing means configured to polarization synthesize two laser beams and a holder member for holding the polarization-synthesizing means with an approximately cylindrical circumferential surface, and a supporting member for supporting the holder member at least to rotate about an central axis and fixing the holder member at a predetermined position.

21 Claims, 25 Drawing Sheets

FOREIGN PATENT DOCUMENTS

| | | |
|---|---|---|
| JP | 4-180282 | 6/1992 |
| JP | 4-369888 | 12/1992 |
| JP | 05-53082 | 3/1993 |
| JP | 05-121838 | 5/1993 |
| JP | 7-72426 | 3/1995 |
| JP | 7-99477 | 4/1995 |
| JP | 08-248259 | 9/1996 |
| JP | 8-254668 | 10/1996 |
| JP | 9-162490 | 6/1997 |
| JP | 9-214022 | 8/1997 |
| JP | 10-62720 | 3/1998 |
| JP | 2000-31575 | 1/2000 |
| JP | 2001-59925 | 3/2001 |
| JP | 2002-023019 | 1/2002 |

OTHER PUBLICATIONS

Yoshihiro Emori, et al., "Demonstration of Broadband Raman Amplifiers: a Promising Application of High-power Pumping Unit", http://www.furukawa.co.jp/review/backnum.htm, WDM Team. Opto-technology Lab., R & D Div. No. 19, Apr. 2000, pp. 42-45 (with English translation).

Patent Abstracts of Japan, JP 62-189422, Aug. 19, 1987.

* cited by examiner

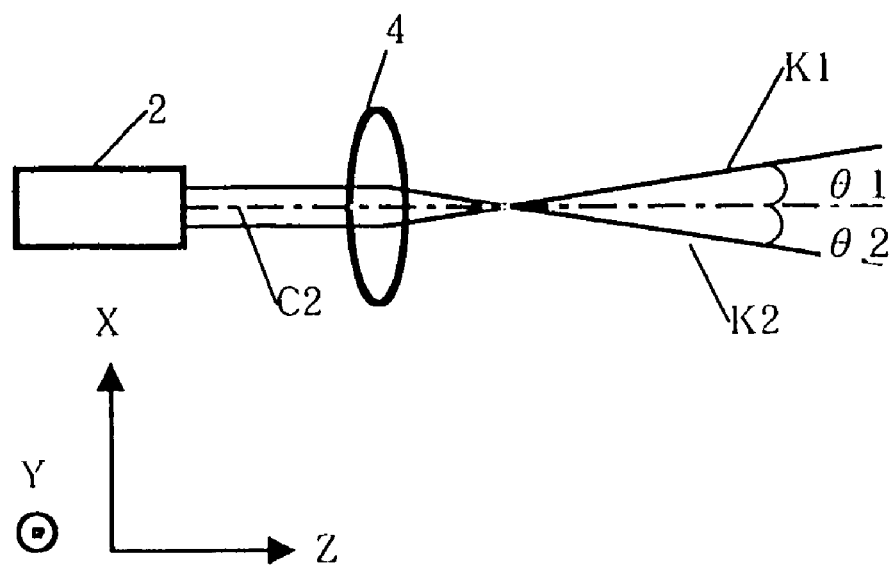
Fig. 6(A)
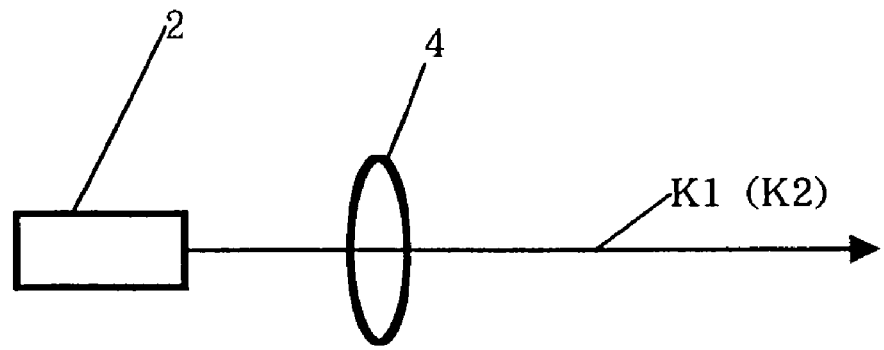
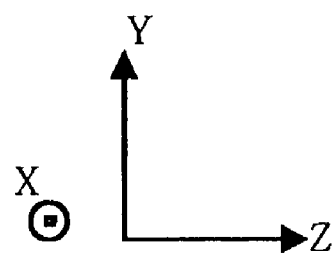
Fig. 6(B)

Fig. 13
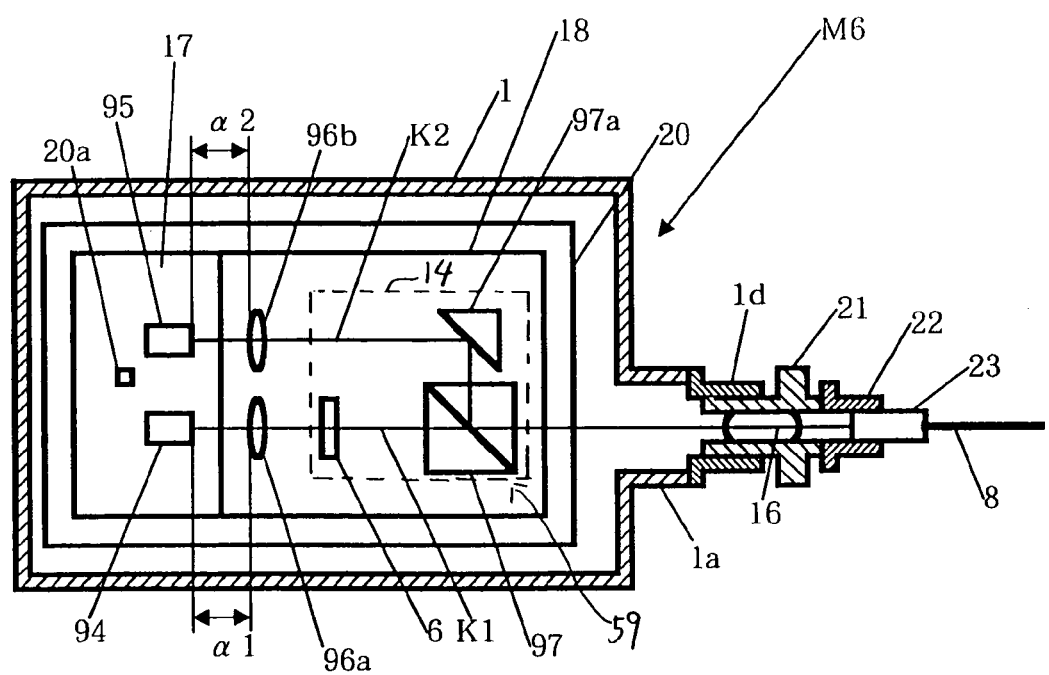
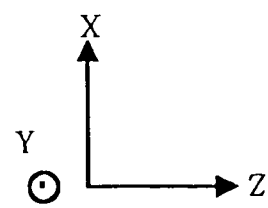

Fig. 15
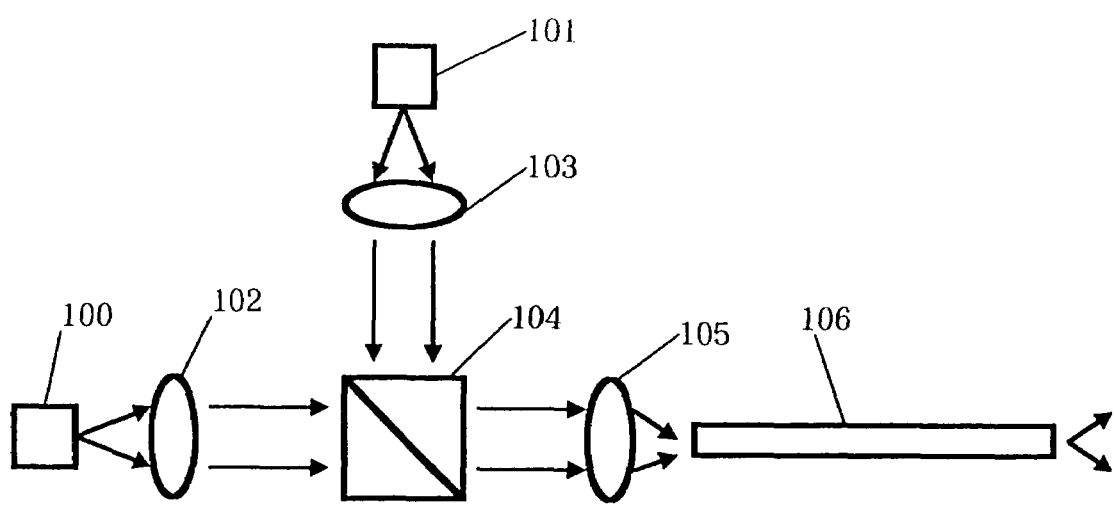
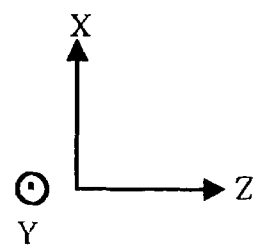

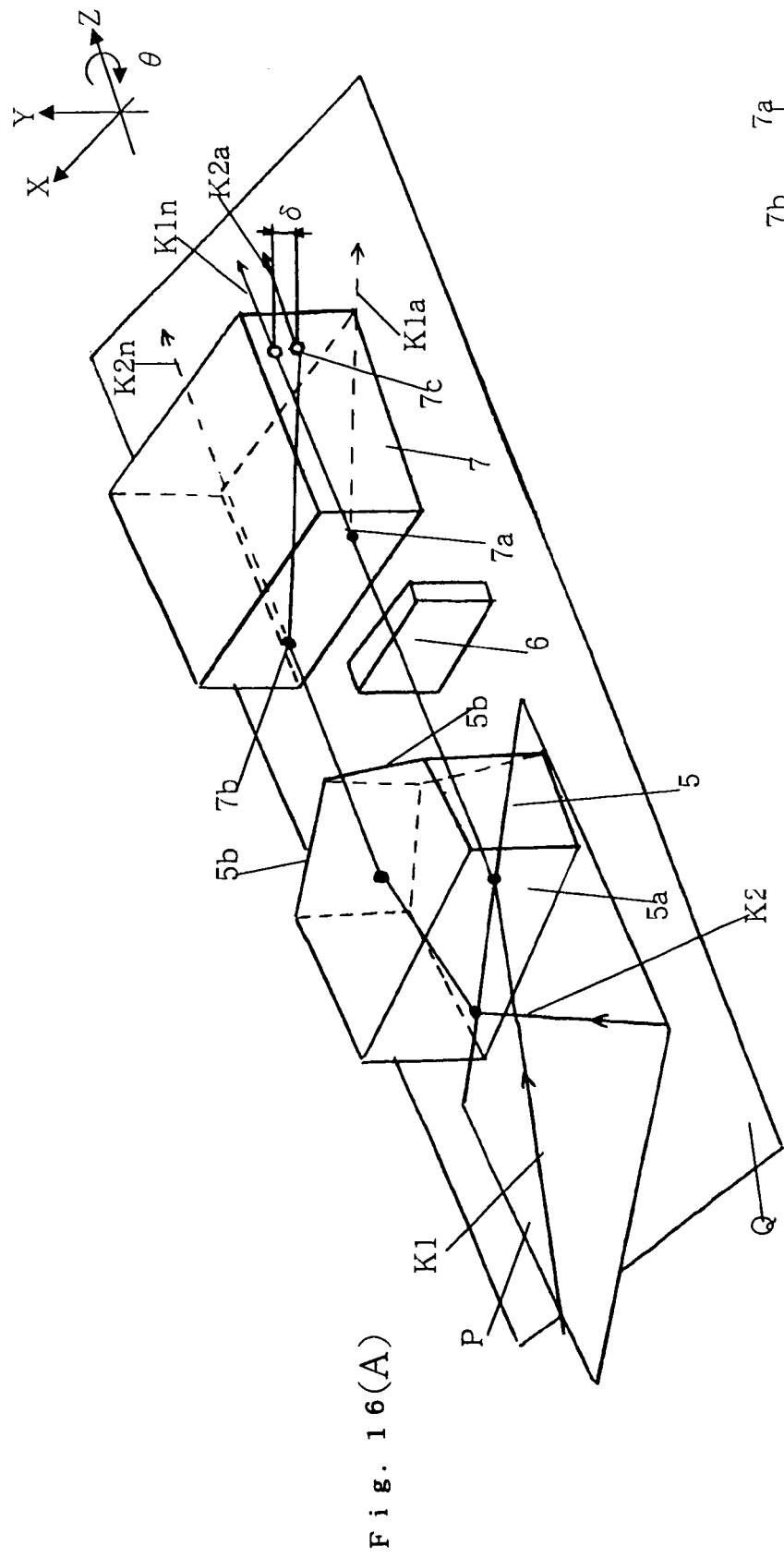
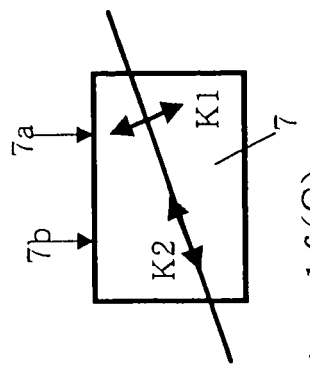
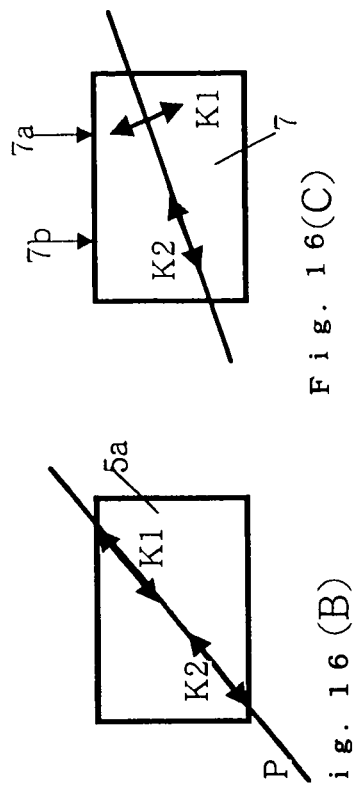
Fig. 16(A)
Fig. 16(B)
Fig. 16(C)

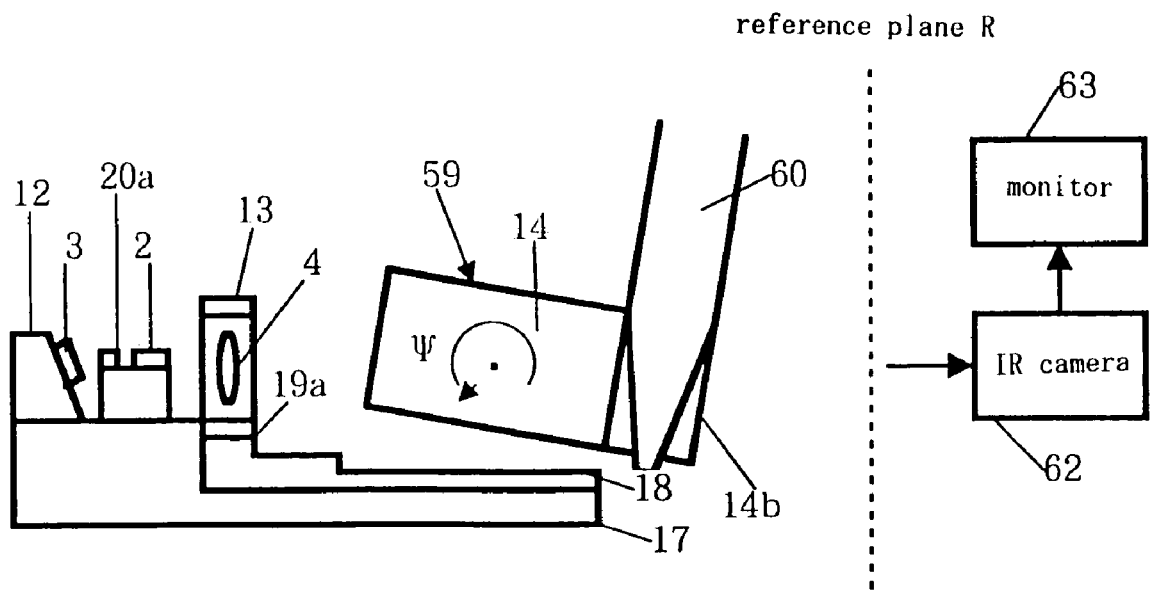
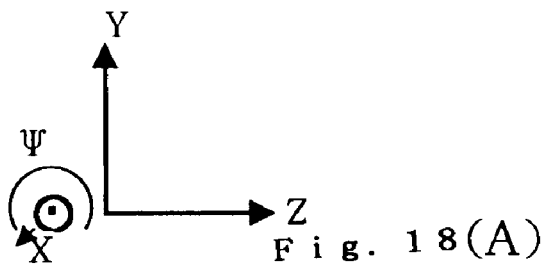
Fig. 18(A)
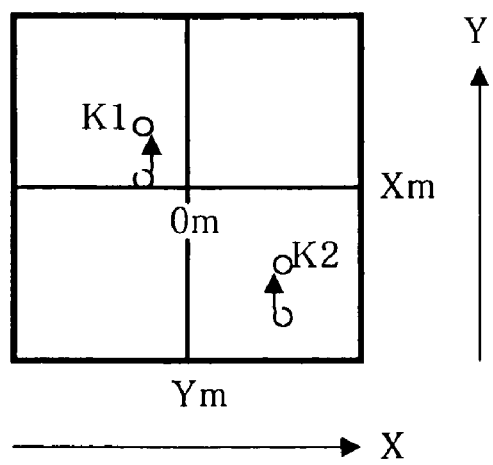
Fig. 18(B)

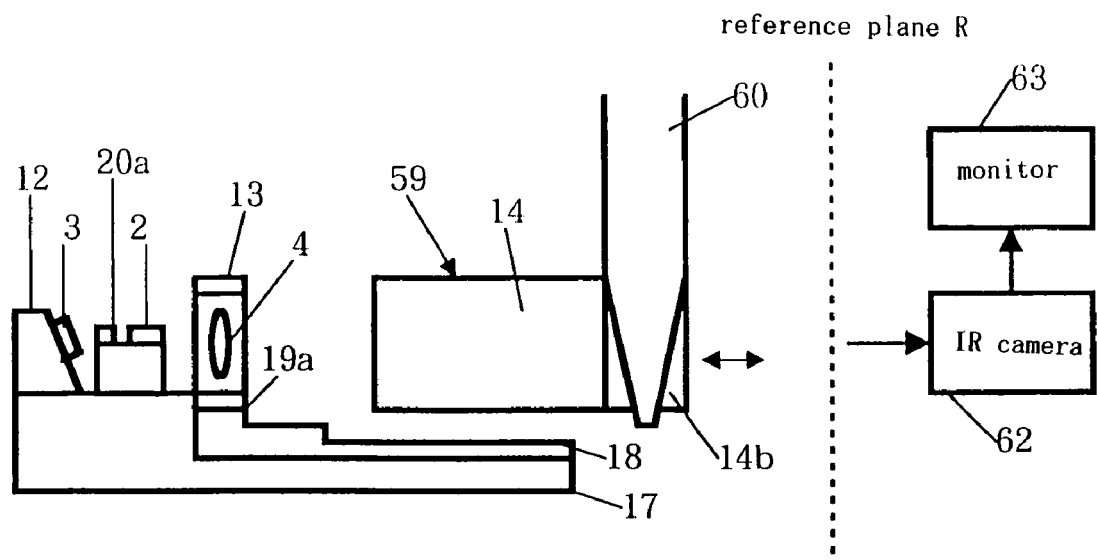
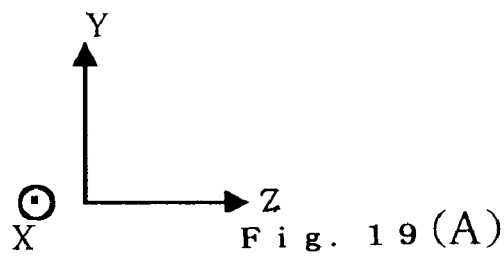
Fig. 19(A)
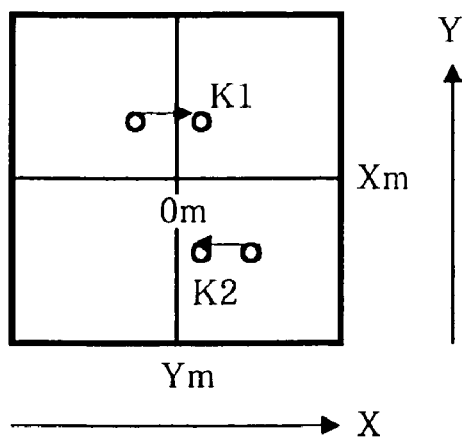
Fig. 19(B)

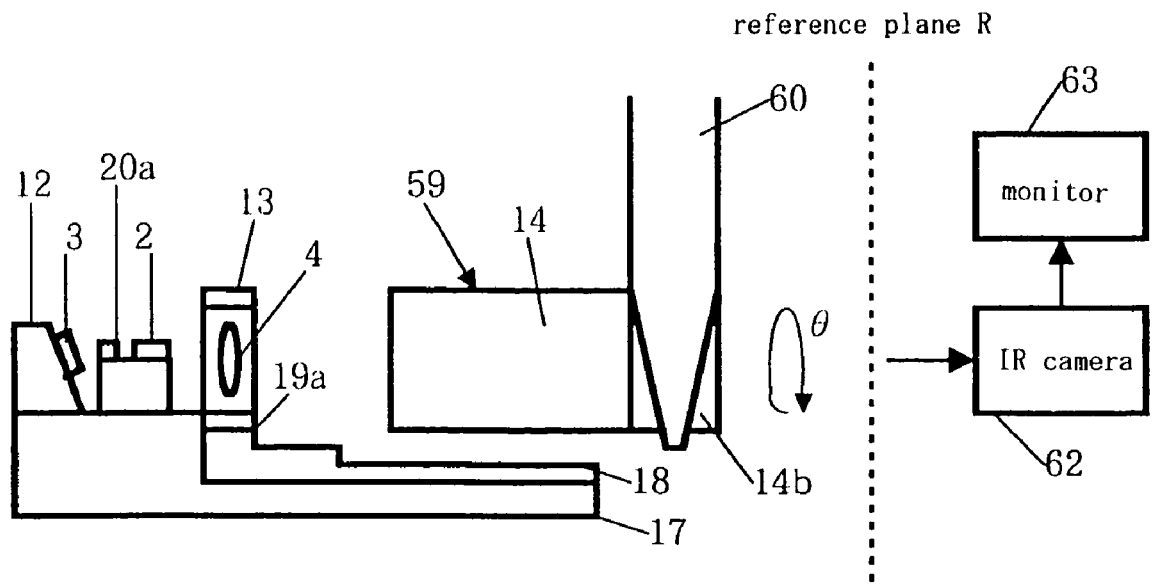
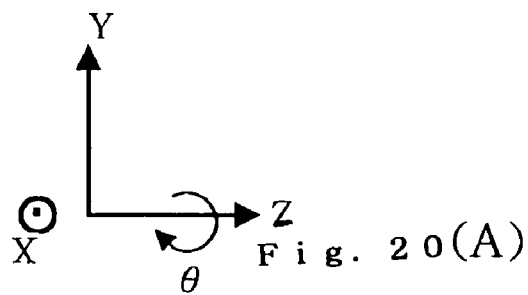
Fig. 20(A)
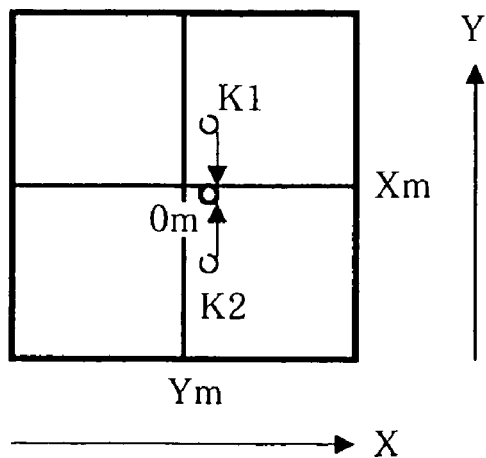
Fig. 20(B)

Fig. 25
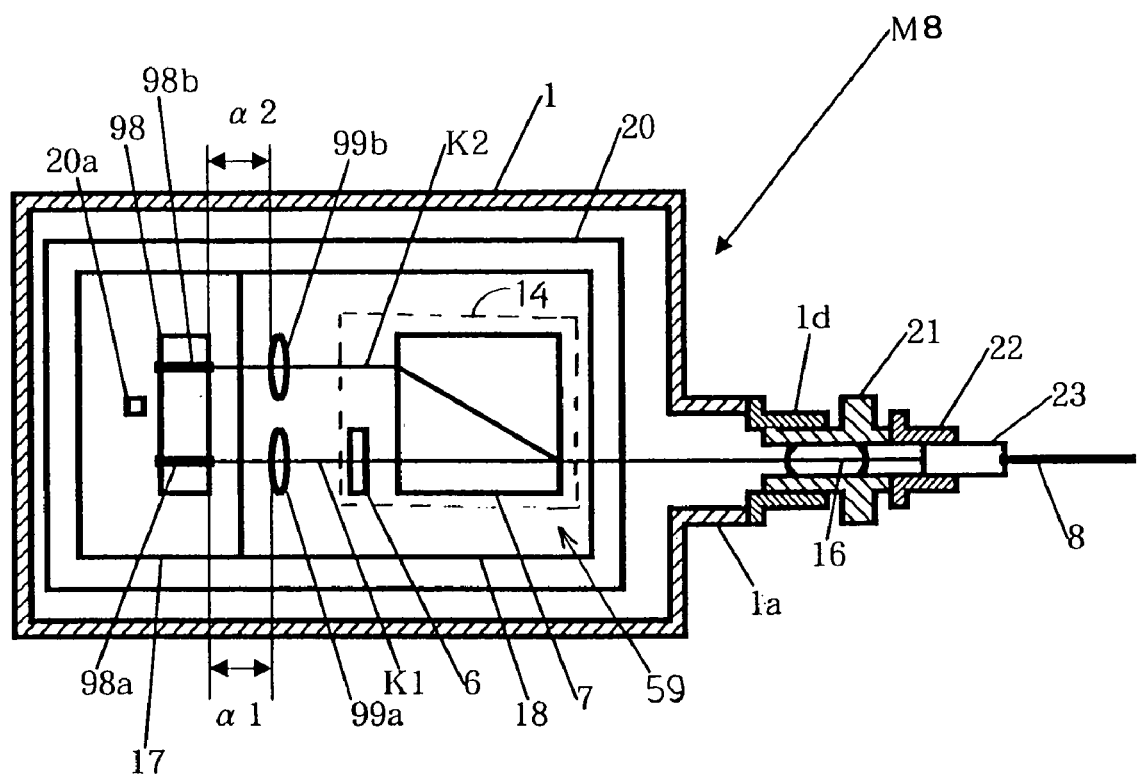
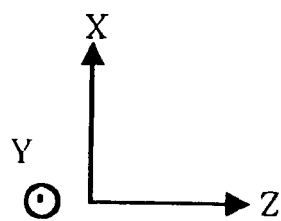

SEMICONDUCTOR LASER MODULE AND METHOD OF MANUFACTURING THE SAME

BACKGROUND

(1) Technical Field

The present invention relates to a semiconductor laser module and a method of manufacturing the same.

(2) Description of Related Art

Up to now, a semiconductor laser device that outputs laser light obtained by combining two laser lights (or through polarization synthesis of two laser lights) has been disclosed in, for example, U.S. Pat. No. 5,589,684 B or JP 2000-31575 A.

FIG. 15 is an explanatory diagram showing a conventional semiconductor laser apparatus as disclosed in U.S. Pat. No. 5,589,684.

As shown in FIG. 15, the conventional semiconductor laser apparatus comprises a first semiconductor laser device 100 and a second semiconductor laser device 101 emitting laser beams of identical wavelengths in mutually orthogonal directions; a first collimating lens 102 configured to collimate the laser beam emitted from the first semiconductor laser device 100; a second collimating lens 103 configured to collimate the laser beam emitted from the second semiconductor laser device 101; a polarization-synthesizing device (i.e. cube beam splitter) 104 configured to polarization-synthesize the laser beams that were collimated by the first collimating lens 102 and the second collimating lens 103; a convergent lens 105 configured to converge the laser beams polarization-synthesized by the polarization-synthesizing device 104; and an optical fiber 106 for receiving the laser beams converged by the convergent lens 105 and letting the laser beams travel outside.

In the conventional semiconductor laser apparatus, the laser beams are emitted from the first semiconductor laser device 100 and the second semiconductor laser device 101 in mutually vertical directions and are polarization-synthesized by the polarization-synthesizing device 104 to obtain a laser beam of reduced DOP (Degree Of Polarization) from the optical fiber 106. (This technology will hereinafter be called a prior art 1.)

Further, Japanese Patent Application Laid-open No. 2000-31575 discloses a semiconductor laser module including a thermoelectric cooler; a first and a second semiconductor laser devices mounted on the thermoelectric cooler; two lenses each for collimating the first and second laser beams emitted from the first and second semiconductor laser devices; a polarization-synthesizer for synthesizing the first and second laser beams; and an optical fiber for receiving the laser beams emerging from the polarization synthesizer and letting the laser beams travel outside (see FIG. 5 or FIG. 10 of Japanese Patent Application Laid-open No. 2000-31575). Moreover, the first and second semiconductor laser devices are formed in an LD array, in which the laser diodes are arrayed at a pitch between their light-emitting centers (hereinafter referred to as inter-emission-center pitch) of 500 μm. Further, the first and second convergent lenses are formed in a lens array such as a ball lens array or a Fresnel lens array. (This technology will hereinafter be called a prior art 2.)

Further, the applicant of the present invention has proposed a semiconductor laser module in which two laser beams emitted from two light-emitting stripes (hereinafter referred to simply as stripes) formed in a single semiconductor laser device are polarization-synthesized and received by an optical fiber. (See Japanese patent application No. 2001-383840, for example. This technology will hereinafter be called a related art.)

FIG. 2 is an explanatory diagram schematically showing a configuration of the semiconductor laser module of the related art.

As shown in FIG. 2, the semiconductor laser module of the related art includes a single semiconductor laser device 2 having a first stripe 9 and a second stripe 10 formed in parallel to each other interposed therebetween and emitting a first laser beam K1 and a second laser beam K2 from a front end face (i.e. an end face on right-hand side in FIG. 2) of the first stripe 9 and the second stripe 10 respectively; a first lens 4 positioned so that the first laser beam K1 and the second laser beam K2 are incident therealong and configured to separate the first laser beam K1 and the second laser beam K2 in the direction in which the first and second stripes 9, 10 are arrayed; a half-wave plate 6 (a polarization rotating means) configured to rotate a polarization direction of at least one of the first and second laser beam K1, K2 (i.e. the first laser beam K1 in FIG. 2) by a predetermined angle (by 90 degrees, for example); a PBC (Polarization Beam Combiner) 7 configured to optically synthesize therealong the first laser beam K1 and the second laser beam K2; and an optical fiber 8 optically coupled to the synthesized laser beams emerging from the PBC 7 and letting the synthesized beams to travel outside.

In addition, a prism 5 is disposed between the first lens 4 and the half-wave plate 6 so that the first laser beam K1 and the second laser beam K2 are incident thereon and output therefrom along their respective optical axes parallel to each other. This prism 5 includes an incident surface 5a positioned so that the first laser beam K1 and the second laser beam K2 are incident and vertically disposed to the optical axis of optical fiber 8, and an exit surface 5b inclined at a predetermined angle from the incident surface 5a. Further, a second lens 16 is disposed between the birefringence element 7 and the optical fiber 8 in order to optically couple the first and second laser beams K1, K2 optically combined by the PBC 7 to the optical fiber 8 which is supported by a ferrule 23.

The first laser beam K1 and the second laser beam K2 emitted respectively from the front end face 2a of the first stripe 9 and the second stripe 10 of the semiconductor laser device 2 travel through the first lens 4, intersect and separate until the separation between the two beams is enough, before entering the prism 5.

During propagation through the prism 5, the first laser beam K1 and the second laser beam K2 are made parallel to each other, and are emitted from the prism 5. The first laser beam K1 then enters the half-wave plate 6, where its polarization direction is rotated by 90 degrees, and then enters a first input port 7a of the PBC 7, while the second laser beam K2 enters a second input port 7b of the PBC 7.

The first laser beam K1 incident on the first input port 7a and the second laser beam K2 incident on the second input port 7b are optically coupled along the PBC 7, and output from an output port 7c.

The laser beams emerging from the output port 7c of the PBC 7 are then converged by the second lens 16, enter an end face of the optical fiber 8 supported by the ferrule 23, and propagate to outside.

In Prior Art 1, Prior Art 2, and Related Art, a semiconductor laser device is fixed to the top of a base by solder or the like, and YAG laser welding or the like is used to fix a lens to the top of the base. If the thickness of solder is not uniform or the lens is YAG-welded at a wrong position in this fixing process, for example, it makes the plane defined by optical axes of two laser lights that are emitted from the one or two semiconductor laser devices unparallel to a mount surface (principal surface) of the base to which the semiconductor laser device(s) is (are) to be fixed. In this case, the two laser lights have different spot positions at the output port of the light combining element, and the exit optical axes do not coincide with each other, leading to a failure in combining the light beams appropriately.

In the case of polarization synthesis, a problem is that the intensity of synthesized light after polarization synthesis is lowered by polarization split, which takes place when laser light emitted from the semiconductor laser device enters the light combining element (polarized wave synthesizing element) while polarized in an inappropriate polarization direction.

A specific description is given on the problems referring to FIGS. 16. FIG. 16(A) is a perspective view schematically showing the structure of the semiconductor laser module of Related Art illustrated in FIG. 2. FIG. 16(B) is a diagram showing positions and polarization directions of the laser lights K1 and K2 on the incident surface 5a of the prism 5. FIG. 16(C) is a diagram showing positions and polarization directions of the laser lights K1 and K2 in the input ports 7a and 7b of the PBC 7.

As shown in FIGS. 16(A) and 16(B), when the two laser lights K1 and K2 enter the prism 5 while a plane P, which is defined by the optical axes of the two laser lights K1 and K2, is not parallel to a mount surface Q of a base to which the semiconductor laser device 2 and others are fixed, the laser lights K1 and K2 on the exit surfaces 5b have different refraction angles. Accordingly, the optical axes of the two laser lights that have exited the prism are no longer on the same plane. After the two laser lights K1 and K2 exit the exit surfaces 5b, the laser light K1 of the two laser lights K1 and K2 enters the input port 7a of the light combining element (PBC) 7 with its polarization direction rotated by 90° by the half-wave plate 6 whereas the laser light K2 enters the input port 7b of the light combining element 7 as it is. The laser lights are then subjected to polarization synthesis in the light combining element 7 and exit from the output port 7c. As a result, the laser lights K1 and K2 in the output port 7c are offset from each other in the Y-axis direction by δ and the exit optical axes of the laser lights K1 and K2 do not coincide with each other.

In the case where a polarized wave synthesizing element is used as a light combining element as in the semiconductor laser module of Related Art shown in FIG. 2, the two laser lights K1 and K2 enter the input ports 7a and 7b, respectively, of the light combining element (PBC) 7 with their polarization directions shifted from a given direction as shown in FIG. 16(C). This causes polarization split in which the laser light K1 is split into an ordinary ray K1n and an extraordinary ray K1a, and the laser light K2 is split into an ordinary ray K2n and an extraordinary ray K2a (see FIG. 16(A)). As a result, the intensity of laser light that exits from the output port 7c is lowered.

Accordingly, synthesized light coupled to the optical fiber 8 does not have desired intensity and degree of polarization in some cases.

BRIEF SUMMARY OF THE INVENTION

The present invention has been made to solve the problems described above, and an object of the present invention is to provide a semiconductor laser module and a method of manufacturing the same in which alignment can be made to make two laser lights coincide in position and exit optical axis with each other when combining the two laser lights through polarization synthesis or wavelength multiplexing and outputting the synthesized light.

Another object of the present invention is to provide a semiconductor laser module and a method of manufacturing the same in which, when a polarized wave synthesizing element is used as a light combining element, each laser light enters the polarized wave synthesizing element while polarized in a given polarization direction to avoid polarization split in the light combining element.

In order to solve the above problems, the present invention has the following structure:

A semiconductor laser module according to the present invention includes:

a semiconductor laser device for emitting first and second laser lights;

a first lens where the first and second laser lights enter to exit in given directions;

a light combining module with a light combining element held in a holder member, the light combining element having a first input port on which the first laser light is incident, a second input port on which the second laser light is incident, and an output port from which a laser light obtained by combining the first laser light incident on the first input port and the second laser light incident on the second input port is outputted;

a base having a mount surface to which the semiconductor laser device is mounted; and an optical fiber for receiving the laser light that has exited the light combining element from the output port to send the laser light to the outside, the module being characterized in that:

the holder member of the light combining module has an approximately cylindrical circumferential surface with a central axis positioned approximately parallel to the axial direction of the optical fiber; and a supporting member is further provided to support and fix the light combining module after the light combining module is moved for positioning at least to rotate about an axis extended from the axis of the optical fiber.

In the semiconductor laser module according to the present invention structured as above, the light combining element is held in the holder member that has an approximately cylindrical circumferential surface with a central axis positioned approximately parallel to the axial direction of the optical fiber to serve as the light combining module, and the supporting member is provided to support and fix the light combining member after the light combining module is moved for positioning at least to rotate about an axis extended from the axis of the optical fiber. Therefore, even if the semiconductor laser device or the first lens is fixed in a wrong posture making a plane that is defined by optical axes of plural laser lights unparallel to the mount surface of the base, the misalignment can be individually corrected to make the plural laser lights coincide in spot position and exit optical axis with one another in the output port of the light combining element by rotating the light combining module about an axis extended from the axis of the optical fiber before the light combining module is fixed to the supporting member.

In addition, two laser lights can be polarized in a given direction before the laser lights enter a polarized wave synthesizing element to thereby avoid polarization split in the polarized wave synthesizing element.

The supporting member for supporting and fixing the light combining module may be two erect walls which are perpendicular to the base and which run parallel to each other in the axial direction of the optical fiber, and the light combining module may be supported and fixed with the circumferential surface of the holder member fit between the two erect walls.

According to the above structure, the approximately cylindrical circumferential surface of the light combining module, which is aligned in the axial direction of the optical fiber, in a direction about the axis of the optical fiber, and in a direction about an axis that is perpendicular to the central axis of the optical fiber and parallel to the mount surface of the base, is supported and fixed between the two erect walls which are perpendicular to the base and which run parallel to each other in the axial direction of the optical fiber. Therefore the light combining module can be supported and fixed no matter how the light combining module is arranged as a result of the alignment.

The supporting member for supporting and fixing the light combining module may have a bottom plate to be joined to the base and two erect walls which stand on the ends of the bottom plate in parallel to each other, and the light combining module may be supported and fixed to the base through the supporting member with the circumferential surface of the holder member positioned between the two erect walls.

In the above structure, the light combining module is aligned in various directions including a direction about the axis of the optical fiber, and is fixed to the base with the circumferential surface supported between the two erect walls of the second supporting member, which has the bottom plate to be joined to the base and the two erect walls standing on the ends of the bottom plate in parallel to each other. Therefore, the light combining module can be moved for alignment in the axial direction of the optical fiber, in a direction perpendicular to the mount surface of the base, and in a direction that is perpendicular to the axial direction of the optical fiber and parallel to the mount surface, and in directions about these three directions. No matter how the light combining module is arranged as a result of the alignment, the supporting member can flexibly adapt to the way the light combining module is arranged and can fix the light combining module to the top of the base by adjusting the position of the supporting member on the base such that the approximately cylindrical circumferential surface of the light combining module is fit between the two erect walls of the supporting member.

The holder member may further have two level faces that are parallel to each other and to the central axis.

According to this structure, gripping the light combining module in a chuck of an aligning device is made easy.

The light combining element used in the semiconductor laser module of the present invention is, for example, a polarized wave synthesizing element, and the holder member may further hold a polarization rotating element for rotating the polarization direction of at least one of the first and second laser lights that have exited the first lens.

According to this structure, the semiconductor laser module makes the polarization direction of the first laser light intersect with the polarization direction of the second laser light to obtain through polarization synthesis a high power laser light that is low in degree of polarization, and the polarization rotating element can be positioned at the same time the light combining element is positioned.

In the semiconductor laser module of the present invention, the semiconductor laser device may be a single semiconductor laser device with a first stripe and a second stripe formed apart from each other to emit a first laser light from one end face of the first stripe and a second laser light from one end face of the second stripe.

The first lens may be a single first lens for separating the first laser light and the second laser light in a direction along which the first and second stripes are placed side by side.

A gap between the first stripe and the second stripe may be 100 µm or less.

This structure uses one semiconductor laser device with two stripes each of which emits a laser light and a single first lens for separating the two laser lights in the direction along which the stripes are placed side by side. Therefore, the semiconductor laser device and the first lens can be positioned in a short period of time. Furthermore, two laser lights emitted from two stripes that face each other across a 100 µm gap or less in one semiconductor laser device are not easily affected by warping of a package in the direction perpendicular to the stripes which could cause a difference between two laser lights in terms of fluctuation in efficiency of coupling with an optical fiber. Accordingly, the influence of the warping of the package can be contained in the axial direction of the optical fiber (the direction parallel to the stripes) alone. This makes the semiconductor laser module stable against the warping of the package. Forming two stripes 100 µmm or less apart from each other in one semiconductor laser device is also effective in lowering cost because the number of semiconductor laser devices obtained from one semiconductor wafer is increased.

In addition to the above structure, the semiconductor laser module may have a prism where the first laser light and the second laser light that have exited the first lens enter to be sent to the light combining element in parallel to each other, and the prism may be fixed to the holder member.

According to this structure, the two laser lights that have been propagated unparallel to and well apart from each other since exiting the first lens are made parallel to each other by the prism. Therefore, the light combining element downstream of the prism can have a simple shape, and designing is made easier. In addition, positioning of the prism and positioning of the light combining element can be achieved simultaneously since the prism and the light combining element are fixed to the same holder member.

The semiconductor laser module according to the present invention may include two semiconductor laser devices: a first semiconductor laser device for emitting the first laser light and a second semiconductor laser device for emitting the second laser light.

The thus structured semiconductor laser module may be further provided with a mirror having a reflection surface where the first laser light or the second laser light enters to be reflected toward the light combining element, and the mirror may be fixed to the holder member.

In the semiconductor laser module structured as above, the mirror and the light combining element are together fixed to the holder member that has an approximately cylindrical circumferential surface to be integrated into one as the light combining module. Therefore, the mirror can be positioned at the same time the light combining element is positioned.

In the semiconductor laser module structured as above, the first lens may be a combination of two lenses with one receiving the first laser light and the other receiving the second laser light. Alternatively, the first lens may be a lens array.

A method of manufacturing the semiconductor laser module according to the present invention is characterized by including a light combining module alignment step in which the light combining module is positioned such that spots of the first and second laser lights overlap each other in the output port of the light combining element.

The light combining module alignment step may include a step of moving the light combining module for positioning in at least one direction out of the axial direction of the optical fiber, a direction about the axis of the optical fiber, and a direction about an axis that is perpendicular to the axis of the optical fiber and parallel to the mount surface.

In the method of manufacturing the semiconductor laser module thus structured according to the present invention, the light combining module is moved in at least one direction out of the axial direction of the optical fiber, a direction about the axis of the optical fiber, and a direction about an axis that is perpendicular to the axis of the optical fiber and parallel to the mount surface. Therefore, positions and exit optical axes of plural laser lights can be made coincide with one another in the output port of the light combining element.

In addition, the light combining module can be aligned in a manner that prevents polarization split in a polarized wave synthesizing element by polarizing two laser lights in a given direction before the laser lights enter the polarized wave synthesizing element.

The light combining module alignment step may be about positioning the light combining module such that the first laser light and the second laser light overlap with each other on a virtual reference plane set between the output port and the optical fiber.

According to this structure, a virtual reference plane is set between the output port of the light combining element and the optical fiber, and the light combining module is adjusted so that plural laser lights overlap with one another on the virtual reference plane. This enlarges a slight offset between the beams in the exit direction in the output port of the light combining element as a positional offset on the virtual reference plane apart from the output port, and therefore the offset can be detected with precision. The plural laser lights thus can be matched in position and in exit direction more accurately.

The method of manufacturing the semiconductor laser module according to the present invention may further include a step of positioning the light combining module such that the maximum amount of light is coupled to a dummy fiber placed in a position where laser light outputted from the output port of the light combining element can be received.

With this structure, whether plural laser lights are matched in position and exit optical axis direction or not can be estimated from the amount of light coupled to the dummy fiber, and the light combining module is aligned such that the light amount reaches the maximum.

In the method of manufacturing the semiconductor laser module according to the present invention, the supporting member may be two erect walls which are perpendicular to the base and which run parallel to each other in the axial direction of the optical fiber, and the method may further include a step of fixing the circumferential surface of the holder member of the light combining module to the erect walls of the supporting member.

According to the above structure, the approximately cylindrical circumferential surface of the light combining module, which is aligned in the axial direction of the optical fiber, in a direction about the axis of the optical fiber, and in a direction about an axis that is perpendicular to the central axis of the optical fiber and parallel to the mount surface of the base, is fixed to the two erect walls which are perpendicular to the base and which run parallel to each other in the axial direction of the optical fiber. Therefore the light combining module can be supported and fixed no matter how the light combining module is arranged as a result of the alignment.

Alternatively, in the method of manufacturing the semiconductor laser according to the present invention, the supporting member may have a bottom plate to be joined to the base and two erect walls which stand on the ends of the bottom plate in parallel to each other, and the method may further include a step of fixing the supporting member to the base and a step of fixing the circumferential surface of the holder member of the light combining module to the erect walls of the supporting member.

In the method of manufacturing the semiconductor laser module structured as above, the light combining module is aligned in various directions including a direction about the axis of the optical fiber, the circumferential surface of the light combining module is supported between the two erect walls of the second supporting member, which has the bottom plate to be joined to the base and the two erect walls standing on the ends of the bottom plate in parallel to each other, and the supporting member is fixed to the base while the light combining module is fixed to the erect walls of the supporting member. Therefore, the light combining module can be moved for alignment in the axial direction of the optical fiber, in a direction perpendicular to the mount surface of the base, and in a direction that is perpendicular to the axial direction of the optical fiber and parallel to the mount surface, and in directions about these three directions. No matter how the light combining module is arranged as a result of the alignment, the supporting member can flexibly adapt to the way the light combining module is aligned and can fix the light combining module to the top of the base by adjusting the position of the supporting member on the base such that the approximately cylindrical circumferential surface of the light combining module is fit between the two erect walls of the supporting member.

BRIEF DESCRIPTION OF DRAWINGS

FIGS. 6(A) and (B) are explanatory diagrams showing an alignment process of the first lens;

FIGS. 7(A) and (B) are explanatory diagrams showing a structure of a semiconductor laser device, of which FIG. 7(B) is a cross sectional diagram taken along the line a—a in FIG. 7(A);

FIG. 13 is an explanatory diagram schematically showing a configuration of the semiconductor laser module in accordance with the second embodiment of the present invention;

FIG. 14 is an explanatory diagram schematically showing a configuration of the semiconductor laser module in accordance with the third embodiment of the present invention.

FIG. 15 is an explanatory diagram showing a conventional semiconductor laser apparatus as disclosed in U.S. Pat. No. 5,589,684;

FIG. 16 is explanatory diagram for explaining the problem of the prior art and the related art;

FIG. 18 is an explanatory diagram showing an alignment process and a fixation process of the polarization-synthesizing module;

FIG. 19 is an explanatory diagram showing an alignment process and a fixation process of the polarization-synthesizing module;

FIG. 20 is an explanatory diagram showing an alignment process and a fixation process of the polarization-synthesizing module;

FIG. 22 is an explanatory diagram showing an alignment process and a fixation process of the polarization-synthesizing module;

FIG. 25 is a plan view showing a semiconductor laser module according to a fourth embodiment of the present invention.

DETAILED DESCRIPTION OF PREFERRED EMBODIMENTS

Embodiments of the present invention will hereinafter be described with reference to the accompanying drawings.

First Embodiment

Figure 1A:
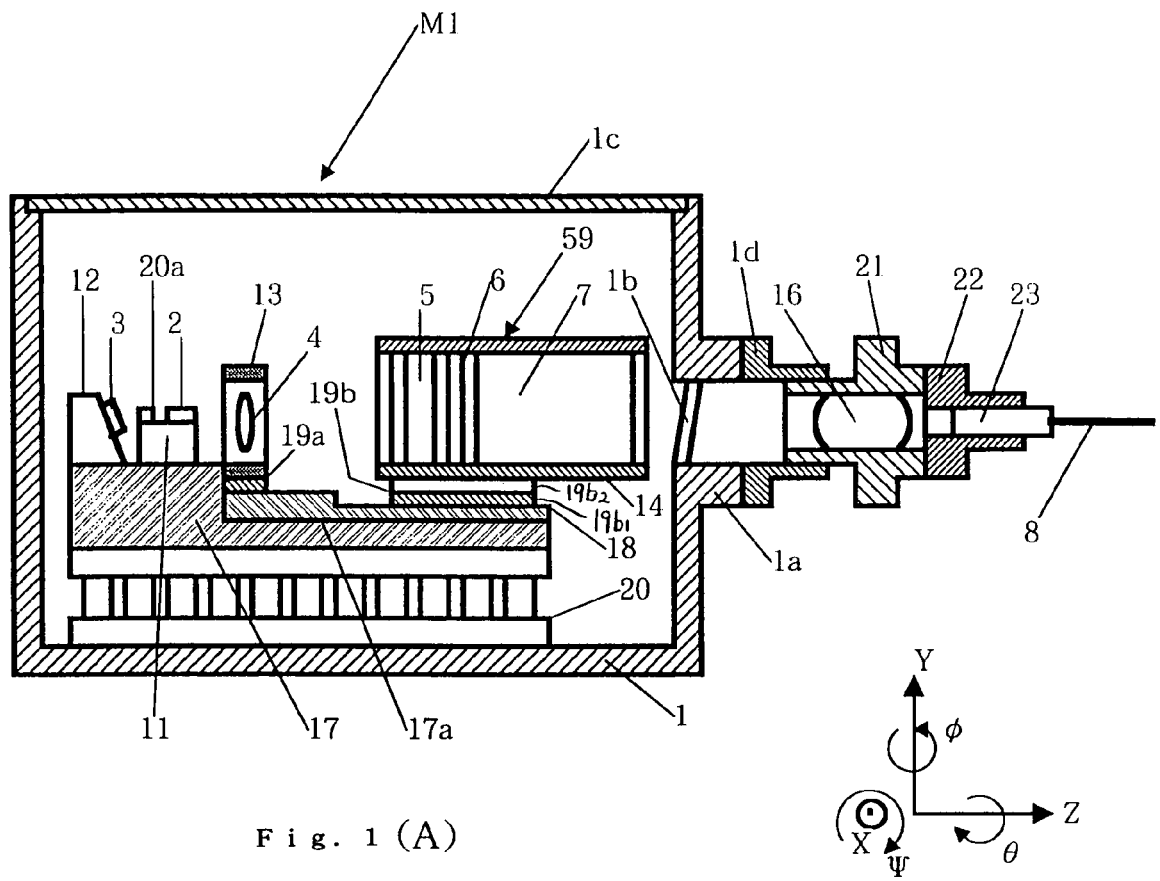
FIG. 1(A) is a side sectional view showing a configuration of a semiconductor laser module in accordance with a first embodiment of the present invention.
Figure 1B:
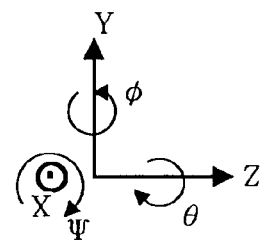
FIG. 1(B) is a side view showing a state where a semiconductor laser device is fixed onto a heat sink.
Figure 2:
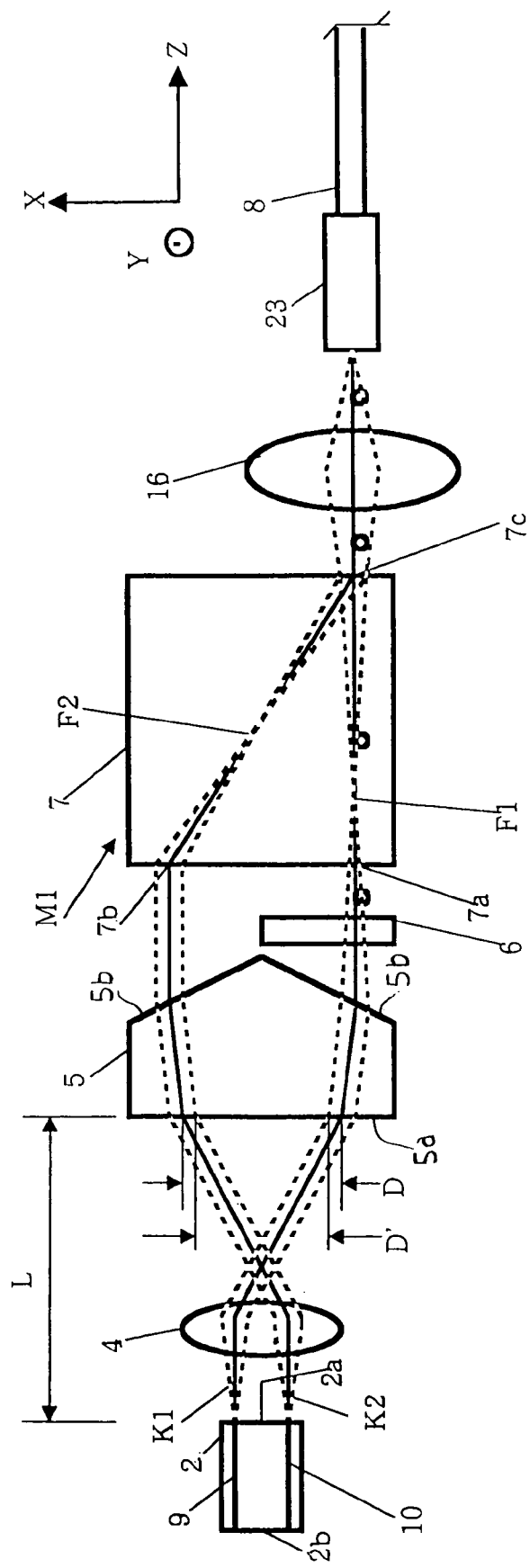
FIG. 2 is an explanatory diagram schematically showing a configuration of an optical system used in the semiconductor laser module in accordance with the first embodiment of the present invention.

FIG. 1(A) is a side sectional view showing a configuration of a semiconductor laser module in accordance with a first embodiment of the present invention. FIG. 1(B) is an enlarged view of a surrounding portion of a semiconductor laser device 2 in FIG. 1(A). FIG. 2 is an explanatory diagram schematically showing the configuration of an optical system of the semiconductor laser module in accordance with the first embodiment of the present invention.

As shown in FIG. 1(A), a semiconductor laser module M1 in accordance with the first embodiment of the present invention includes a package 1 whose interior is hermetically sealed, the semiconductor laser device 2 encased in the package 1 for emitting laser lights, a photodiode (a light receiving element) 3, a first lens 4, a prism 5, a half-wave plate (a polarization rotator) 6, a light combining element (polarized wave synthesizing element, PBC) 7, and an optical fiber 8.

The semiconductor laser device 2 includes, as shown in FIG. 2, a first stripe 9 and a second stripe 10 disposed with an interval on the same plane and extending in parallel in the longitudinal direction. The semiconductor laser device 2 emits a first laser light K1 and a second laser light K2 respectively from end faces of the first and second stripes 9 and 10. Denoted by K1 and K2 in FIG. 2 are trajectories of the centers of the laser lights that exit the first and second stripes 9 and 10, respectively. The laser light propagates, as indicated by a broken line in FIG. 2, with some divergence about the center thereof. A space between the first stripe 9 and the second stripe 10 is set as 100 μm or less, e.g., approximately 40 to 60 μm in order for the beams K1 and K2 exiting the stripes 9 and 10 to enter one piece of first lens 4. Moreover, the space between the stripes is narrow, whereby a difference in optical output characteristic between the stripes decreases.

As shown in FIGS. 1(A) and 1(B), the semiconductor laser device 2 is fixed to the top of a first base 17 through a diamond heat sink 58 and a chip carrier 11. Solder (Au—Sn or the like) is used to join the semiconductor laser device 2 with the diamond heat sink 58, to join the diamond heat sink 58 with the chip carrier 11, and to join the chip carrier 11 to the first base 17.

The photodiode 3 receives a monitor laser light emitted from a rear-sided (left-sided in FIG. 1(A)) end face 2b (see FIG. 2) of the semiconductor laser device 2. The photodiode 3 is fixedly attached to a photodiode carrier 12.

The first and second laser lights K1 and K2 exiting a front-sided (right-sided in FIG. 1(A)) end face 2a (see FIG. 2) of the semiconductor laser device 2 are incident upon the first lens 4, and the first lens 4 functions to cause the laser lights K1 and K2 to intersect each other, and serves to converge the laser lights K1 and K2 at focus positions (F1, F2) different from each other with a divergence between the first and second laser lights K1 and K2 in the extending direction of the stripes 9 and 10 for the beam split (see FIG. 2).

Normally, parallel beams transformed into a large spot size have an angular deviation tolerance in optical parts, which is as strict as 0.1° or smaller; however, the angular tolerance in the optical parts slackens in the condenser system focusing and propagating the laser light. The first lens 4 is used as a condenser optical lens, whereby a tolerance of configurations of the optical parts, a positioning tolerance and a beam angular adjusting tolerance slacken. This is a preferable aspect.

The use of the first lens 4 as a converging lens also reduces the spot diameter of laser light propagated, which makes it possible to reduce in size of optical parts used.

As shown in FIG. 1(A), the first lens 4 is held by a first lens holder member 13. The first lens 4 is preferably positioned as shown in FIG. 2 so that the optical axis of the first laser light K1 emerging from the first stripe 9 and the optical axis of the second laser light K2 emerging from the second stripe 10 show substantially a symmetry about the central axis of the first lens 4. With this arrangement, both of the first and second laser lights K1 and K2 travel through the vicinity of the central axis of the first lens 4 that is defined as an area with a small aberration, and hence there is a decreased scatter on the wave front of the laser lights, with the result that the optical coupling efficiency to the optical fiber 8 rises. As a result, the semiconductor laser module M1 having a higher optical output may be obtained. Note that the first lens 4 preferably involves the use of an aspherical lens exhibiting a small spherical aberration and a high optical coupling efficiency to the optical fiber 8 to restrain an influence of a spherical aberration.

The prism 5 is disposed between the first lens 4 and the PBC 7 and substantially collimates the optical axes of the incident first and second laser lights K1 and K2 while correcting optical paths thereof, thus making the laser lights K1 and K2 exit the prism 5 itself.

Figure 3A:
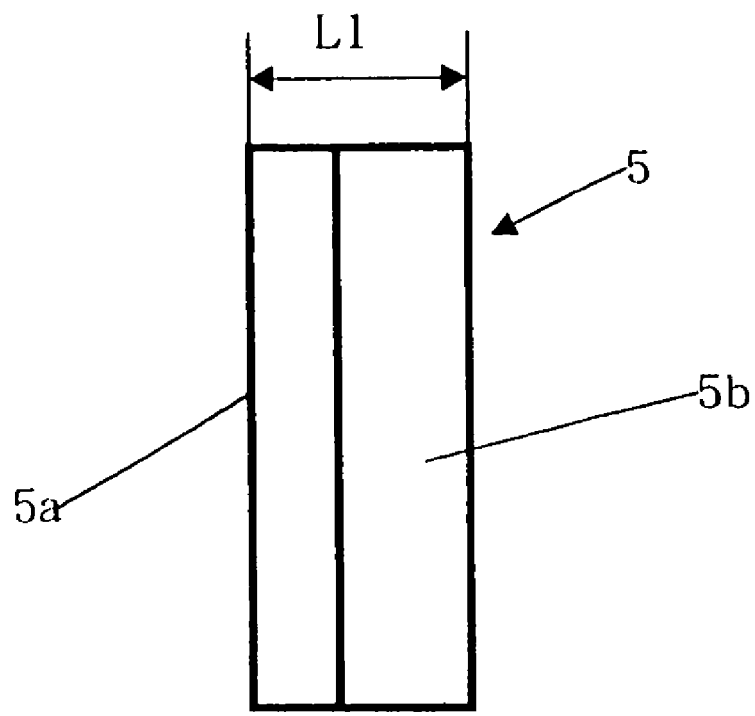
FIG. 3(A) is a side view showing a shape of a prism.
Figure 3B:
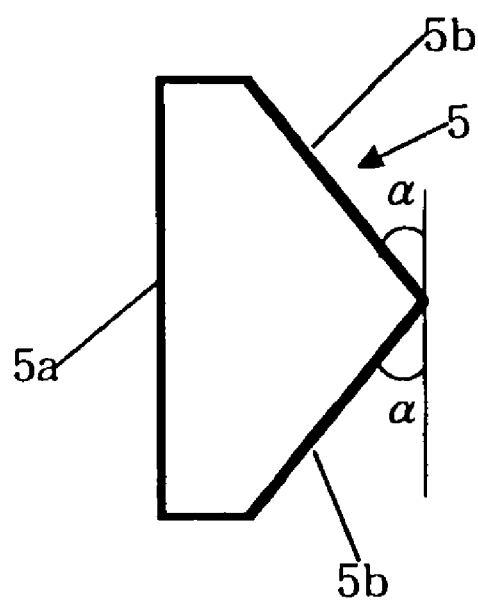
FIG. 3(B) is a plan view thereof.

FIG. 3(A) is a side view showing a configuration of the prism 5, and FIG. 3(B) is a plan view thereof. As shown in FIGS. 3, the prism 5 includes an incident surface 5a formed flat and an exit surface 5b inclined at a predetermined angle a from the incident surface 5a. For example, in the case where: the prism 5 is composed of BK7 (borosilicate crown glass); an interval between stripes of the semiconductor laser device is 40 μm; and the first lens having a focal distance of 0.7 mm is used, the prism 5 is approximately 1.0 mm in its entire length L1, and the angle $\alpha$ is set to 3.2°±0.1°.

The optical axes of the first and second laser lights K1 and K2 propagated from the first lens 4 unparallel to each other, which are refracted at the incident surface 5a and the exit surfaces 5b of the prism 5, are made parallel to each other. This facilitates manufacture of the PBC 7, which is placed downstream of the prism 5, and makes it possible to reduce the size of the PBC 7, resulting in a reduction in size of the semiconductor laser module M1.

As shown in FIG. 2, the half-wave plate 6 admits an incidence of only the first laser light K1 of the first and second laser lights K1 and K2 passing through the prism 5, and serves as polarization rotating means for rotating by 90 degrees a polarization direction of the first laser light K1 incident thereupon. The first lens 4 makes the first and second laser lights K1 and K2 split thoroughly, whereby the half-wave plate 6 becomes easy to dispose.

The PBC 7 has a first input port 7a on which the first laser light K1 is incident, a second input port 7b on which the second laser light K2 is incident, and an output port 7c where the first laser light K1 entering the first input port 7a and the second laser light K2 entering the second input port 7b are multiplexed and thus exit. The PBC 7 is classified as, for instance, a birefringence element through which the first laser light K1 propagates as an ordinary ray to the output port 7C and the second laser light K2 propagates as an extraordinary ray to the output port 7c. The PBC 7, if being the birefringence element, is composed of, e.g., $TiO_2$ (rutile) to obtain a high index of birefringence and a large divergent width between the laser lights.

Figure 4A:
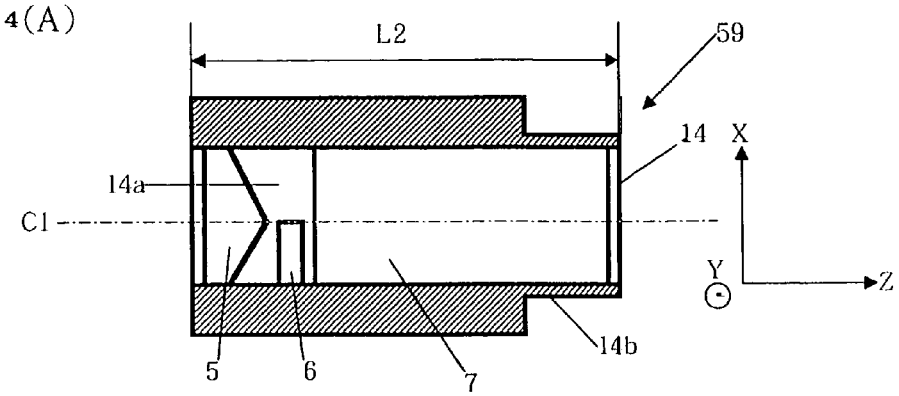
FIG. 4(A) is a plan sectional view of a polarization-synthesizing module taken along the line A—A in FIG. 4(B)
Figure 4B:
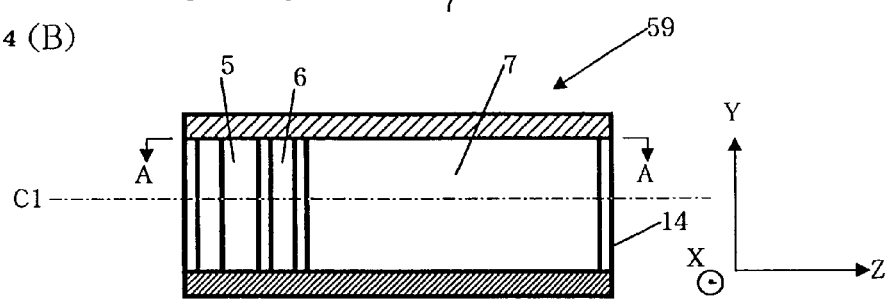
FIG. 4(B) is a side sectional view thereof.
Figure 4C:
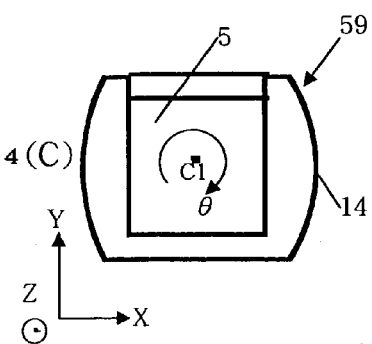
FIG. 4(C) is a front view thereof.
Figure 4E:
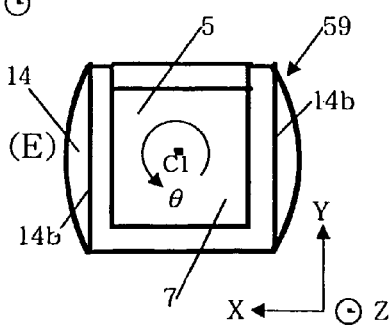
FIG. 4(E) is a rear elevation thereof.
Figure 4D:
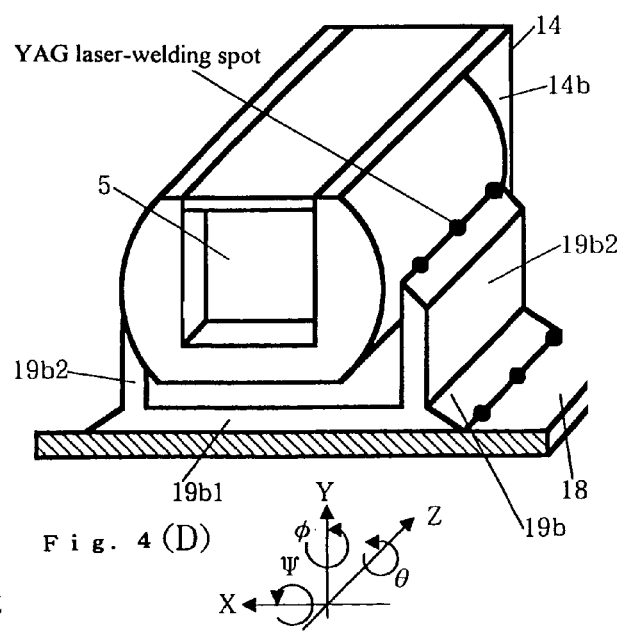
FIG. 4(D) is a perspective view thereof.

In this embodiment, a light combining module 59 is adopted in which the prism 5, the half-wave plate 6, and the PBC 7 are fixed to the same holder member 14. FIG. 4(A) shows the light combining module 59, which is a cross sectional view taken along the line A—A of FIG. 4(B). FIG. 4(B) is a cross sectional side view thereof. FIG. 4(C) is a front view thereof. FIG. 4(D) is a perspective view showing the module together with the second supporting member 19b. FIG. 4(E) is a back view thereof. As shown in FIGS. 4, the holder member 14 of the light combining module 59 is composed of a material (for example, SUS403, SUS304, and so on) suitable for YAG laser welding. The holder member 14 is approximately 7.0 mm in its entire length L2 and is formed substantially in a cylindrical shape as a whole about the center axis C1. The cylindrical circumferential surface of the holder member 14 is partly nicked as shown in FIGS. 4 to form two level faces 14b that are parallel to each other. The level faces 14b make it easier for a chuck of an aligning device to grip the holder member 14 in a step of aligning the light combining module 59 which will be described later. The top and bottom of the holder member 14 are level.

A housing portion 14a is formed in the interior of the holder member 14. The prism 5, the half-wave plate 6 and the PBC 7 are fixed to the housing portion 14a.

The light combining module 59 is positioned and fixed as shown in FIG. 4(D). In FIG. 4(D), a second supporting member 19b has a bottom plate 19b1, which is to be joined to a second base 18, and two erect walls 19b2, which stand on the ends of the bottom plate 19b1 in parallel to each other in the longitudinal direction, to have a shape resembling the letter U in section. The approximately cylindrical circumferential surface of the holder member 14 is fit between the two erect walls. The holder member 14 is positioned on the second base 18 such that a central axis C1 of the approximately cylindrical circumferential surface of the holder member 14 is approximately parallel to the axial direction of the optical fiber 8 and that the two laser lights K1 and K2 incident on the incident surface 5a of the prism 5 exit the PBC 7 from the output port 7c in approximately the same direction while overlapping each other. Then, the holder member 14 is fixed to the edges of the two erect walls 19b2 by YAG laser welding.

In this way, the PBC 7 is held in the holder member 14 having an approximately cylindrical circumferential surface to serve as the light combining module 59, which is then supported and fixed between the two erect walls 19b2 of the second supporting member 19b that substantially takes a U-shape in section. This structure makes it easier to align and fix the positions of the prism 5, the half-wave plate 6 and the PBC 7 in the X-axis, Y-axis and Z-axis directions in FIGS. 4 and/or in directions about the Z axis (the angle θ), the X axis (the angle TΨ) and the Y axis (the angle φ), so that the first laser light K1 incident on the first input port 7a of the PBC 7 and the second laser light K2 incident on the second input port 7b together exit from the output port 7c in approximately the same direction while overlapping each other, and that the laser lights K1 and K2 are polarized in a given direction before entering the input ports 7a and 7b of the PBC 7.

In short, whatever positions in the X-axis, Y-axis and Z-axis directions and whatever angles about these axes (Ψ, φ, θ) the light combining module 59 is in as a result of the positioning, the second supporting member 19b can flexibly adapt to the way the light combining module 59 is aligned and can support the light combining module 59 by adjusting the position of the second supporting member 19b on the second base such that the approximately cylindrical circumferential surface of the light combining module 59 is fit between the two erect walls 19b2 of the second supporting member 19b.

In addition, positioning of the prism 5 and the half-wave plate 6 and positioning of the PBC 7 can be achieved at once since the prism 5, the half-wave plate 6, and the PBC 7 are integrated into one in the holder member 14.

As shown in FIG. 2, the optical fiber 8 receives the laser lights exiting the output port 7c of the PBC 7 and emits the laser lights to the outside of the package 1.

A second lens 16 for optical-coupling the laser lights emerging from the output port 7c of the PBC 7 to the optical fiber 8, is disposed between the PBC 7 and the optical fiber 8. In this embodiment, the first lens 4 is positioned so that the first and second laser lights K1 and K2 are focused on points (F1, F2) between the first lens 4 and the second lens 16.

With this contrivance, a spot size of the laser light between the first and second lenses 4 and 16 is reduced, and the laser lights are prevented from overlapping each other. Therefore, a propagation distance L (see FIG. 2) is decreased which is needed for obtaining a divergent width D' of the first and second laser lights K1 and K2 sufficient for the half-wave plate 6 to be inserted only onto an optical path of the first laser light K1. Hence a length of the semiconductor laser module M1 in the optical-axis direction can be reduced. As a result, it is feasible to provide the highly reliable semiconductor laser module M1 exhibiting an excellent stability over time of the optical coupling of the semiconductor laser device 2 to the optical fiber 8 under, e.g., a high-temperature environment.

In addition, optical parts used can be reduced in size since the laser light spot diameter can be reduced between the first lens 4 and the second lens 16.

As shown in FIGS. 1, the chip carrier 11 to which the semiconductor laser device 2 is fixed and the photodiode carrier 12 to which the photodiode 3 is fixed, are fixed by soldering onto a first base 17 taking substantially an L-shape in section. It is preferable that the first base 17 be composed of a Cu—W based alloy and so on in order to enhance a capacity of radiating the heat evolved by the semiconductor laser device 2.

The first lens holder member 13 to which the first lens 4 is fixed and the light combining module 59 with the prism 5, the half-wave plate 6 and the PBC 7 fixed to the holder member 14, are fixed by the YAG laser welding onto a second base 18, formed of a stainless steel which is fixed in advance by silver-soldering onto a flat portion 17a of the first base 17, through a first supporting member 19a and a second supporting member 19b, respectively.

A cooling device 20 constructed of a Peltier element is provided under the first base 17. A thermistor 20a provided on the chip carrier 11 detects a rise in temperature due to the heat radiated from the semiconductor laser device 2. The cooling device 20 is controlled to keep constant the temperature detected by the thermistor 20a. This contrivance makes it feasible to increase and stabilize the output of emission of the laser lights from the semiconductor laser device 2.

A flange portion 1a formed at the side area of the package 1 is provided with a window portion 1b upon which the beams penetrating the PBC 7 are incident in its inside and with a second lens 16 for converging the laser lights at its end. The second lens 16 is held by a second lens holder member 21 fixed by the YAG laser welding to the end of the flange portion 1a. A ferrule 23 holding the optical fiber 8 is fixed by the YAG laser welding through a metallic slide ring 22 to the end of the second lens holder member 21.

Next, operations of the semiconductor laser module M1 in accordance with the first embodiment of the present invention will be explained.

As shown in FIG. 2, the first and second laser lights K1 and K2 emitted from the front-sided end faces 2a of the first and second stripes 9 and 10 of the semiconductor laser device 2, penetrate the first lens 4 and intersect each other. Thereafter, the laser lights K1 and K2 have a sufficient divergence to split thoroughly and then enter the prism 5 of the light combining module 59. A width of divergence (D) between the first and second laser lights K1 and K2 when entering the prism 5 is approximately 460 μm. The first and second laser lights K1 and K2 are collimated by the prism 5 and thus exit (the width of divergence between the laser lights K1 and K2 comes to approximately 500 μm). Then, the first laser light K1 impinges on the half-wave plate 6 within the light combining module 59 and, after its polarization direction has been rotated by 90 degrees, enters the first input port 7a of the PBC 7, while the second laser light K2 enters the second input port 7b of the PBC 7.

In the PBC 7, the first laser light K1 emerging from the first input port 7a and the second laser light K2 emerging from the second input port 7b, undergo the polarization synthesis and exit the output port 7c.

The laser lights emitted from the PBC 7 are converged by the second lens 16, then incident upon the end face of the optical fiber 8, and propagated.

In this embodiment, the prism 5, the half-wave plate 6 and the PBC 7 are thus integrated into one as the polarized wave synthesizing module 59 that has an approximately cylindrical circumferential surface, and the module 59 is supported and fixed between the two erect walls 19b2 of the second supporting member 19b, which substantially takes a U-shape in section and which has the bottom plate 19b1 to be joined to the second base 18 and the two erect walls 19b2 standing on the ends of the bottom plate 19b1 in parallel to each other. This structure makes it easier to align and fix the positions of the prism 5, the half-wave plate 6 and the PBC 7 in a direction that is perpendicular to the axial direction of the optical fiber 8 and parallel to the mount surface of the second base 18 (the direction X in FIGS. 1), a direction that is perpendicular to the mount surface of the second base 18 (the direction Y in FIGS. 1), and the axial direction of the optical fiber 8 (the direction Z in FIGS. 1), and in directions about the X axis (the angle $\Psi$), the Y axis (the angle $\phi$) and the Z axis (the angle $\theta$), so that the first laser light K1 incident on the first input port 7a of the PBC 7 and the second laser light K2 incident on the second input port 7b together exit from the output port 7c in approximately the same direction while overlapping each other, and that the laser lights K1 and K2 are polarized in a given direction before entering the input ports 7a and 7b of the PBC 7.

In short, whatever positions in the X-axis, Y-axis and Z-axis directions and whatever angles about these axes ($\Psi$, $\phi$, $\theta$) the light combining module 59 is in as a result of the positioning, the second supporting member 19b can flexibly adapt to the way the light combining module 59 is aligned and can support the light combining module 59 by adjusting the position of the second supporting member 19b on the second base 18 such that the approximately cylindrical circumferential surface of the light combining module 59 is fit between the two erect walls 19b2 of the second supporting member 19b.

Accordingly, even if the thickness of solder for fixing the semiconductor laser device is not uniform or the first lens is YAG-welded at a wrong position making the plane that is defined by the optical axes of the laser lights emitted from the semiconductor laser device unparallel to the mount surface of the second base 18, the two laser lights can be matched in position and exit direction at the output port of the PBC 7 by aligning the light combining module appropriately. In addition, it is possible to avoid polarization split of the two laser lights K1 and K2 due to the PBC 7 and accordingly to prevent lowering in intensity of the synthesized light. Therefore, synthesized light of high power and low degree of polarization can be obtained from the optical fiber 8 without fail.

Note that the semiconductor laser module M1 in this embodiment involves the use of the single semiconductor laser device 2 formed with the two stripes for emitting the two laser lights and one piece of first lens 4 for splitting the laser lights K1 and K2 from each other, and therefore the time for positioning the semiconductor laser device 2 and the first lens 4 decreases. As a result, it is possible to reduce the time for manufacturing the semiconductor laser module M1.

Furthermore, two laser lights emitted from two stripes that face each other across a 100 µm gap or less in one semiconductor laser device 2 are not easily affected by warping of the package 1 in the direction perpendicular to the stripes (the direction X in FIGS. 1) which could cause a difference between the two laser lights in terms of fluctuation in efficiency of coupling with the optical fiber 8. Accordingly, the influence of the warping of the package 1 can be contained in the axial direction of the optical fiber 8 (the direction Z in FIGS. 1) alone. This makes the semiconductor laser module stable against the warping of the package 1. Forming the two stripes 9 and 10 at an interval of 100 µm or less in one semiconductor laser device 2 is also effective in lowering cost since the number of semiconductor laser devices obtained from one semiconductor wafer is increased.

Further, the use of the single semiconductor laser device 2 enables the compact cooling device 20 such as a Peltier module for cooling the heat evolved from the semiconductor laser device 2 and the decreased power consumption.

The second supporting member 19b in this embodiment has the bottom plate 19b1, which is to be joined to the second base 18, and the two erect walls 19b2, which stand on the ends of the bottom plate 19b1 in parallel to each other, to have a shape resembling the letter U in section. Alternatively, the bottom plate 19b1 that is to be joined to the second base 18 may be omitted, and the two erect walls 19b2 may be formed directly on the second base 18. In this case also, the light combining module 59 can be aligned in the direction Z, the direction θ (a direction about the Z axis), and the direction Ψ (a direction about the X axis) in FIGS. 1. This structure can sufficiently provide the effects of the present invention when there is more tolerance for alignment in the direction X and the direction φ. Note that a method of aligning the light combining module 59 will be described later.

Next, a method of manufacturing the semiconductor laser module M1 in accordance with the first embodiment of the present invention will hereinafter be described.

First, the chip carrier 11 to which the semiconductor laser device 2 is fixed and the photodiode carrier 12 to which the photodiode 3 is fixed, are fixed by soldering onto the first base 17.

Next, the first lens 4 is fixed onto the second base 18, which is silver-soldered beforehand on the flat portion 17a of the first base 17, in a way that aligns the lens 4. In this aligning step of the first lens 4, the semiconductor laser device 2 is supplied with the electric current and emits the first and second laser lights K1 and K2 respectively from both of the first and second stripes 9 and 10 of the semiconductor laser device 2. Then, after setting this beam emitting direction as a reference direction (which is hereinafter referred to "stripe reference direction"), the first lens 4 is inserted and positioned in the X-, Y- and Z-axis directions.

FIGS. 6 are explanatory diagrams showing the aligning step of the first lens 4. In FIGS. 6, it is considered that a Z-axis is parallel to the stripe reference direction, an X-axis includes two stripes and is perpendicular to the Z-axis, and a Y-axis is perpendicular to the Z-axis and the X-axis.

The first lens 4 is, as shown in FIG. 6(A), positioned in the X-axis direction so that an angle θ1 made between the stripe reference direction (a central axis C2) set in the way described above and the first laser light K1 is equal to an angle θ2 made between the stripe reference direction and the second laser light K2. The first lens 4 is, as shown in FIG. 6(B), positioned in the Y-axis direction so that the first and second laser lights K1 and K2 travel through the center of the first lens 4. Further, the first lens 4 is positioned in the Z-axis direction so that a spot size of the laser light is minimized at a predetermined distance from the semiconductor laser device 2. Preferably, the first lens 4 is positioned in the Z-axis direction so that a spot size of the respective laser lights exiting the first lens 4 is minimized at a predetermined position between the first and second lenses 4 and 16. The first lens holder member 13, which holds the first lens 4 positioned in the aligning step described above, is fixed by the YAG laser welding onto the second base 18 through the first supporting member 19a.

Subsequently, the light combining module 59 including the prism 5, the half-wave plate 6 and the PBC 7 as the integral unit, is aligned and fixed onto the second base 18. FIGS. 17 to 24 are explanatory diagrams showing a method of aligning and fixing the light combining module 59. A description is given below step by step on the method of aligning and fixing the light combining module 59.

(First Step)

First, a chuck 60 of an aligning device grips the level faces 14b of the holder member 14 of the light combining module 59. The aligning device places the light combining module 59 in front of the first lens 4 (the opposite side of the semiconductor laser device 2 across the first lens 4), which is fixed to the top of the second base 18 so that the central axis C1 of the holder member 14 is approximately parallel to the stripe reference direction.

Figure 17A:
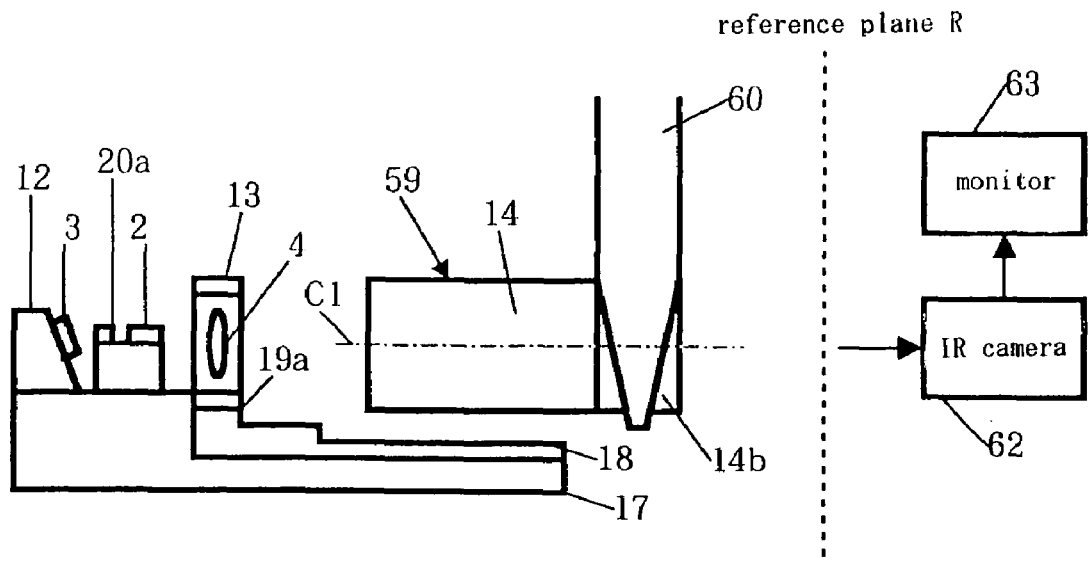
FIG. 17 is an explanatory diagram showing an alignment process and a fixation process of the polarization-synthesizing module.
Figure 17B:
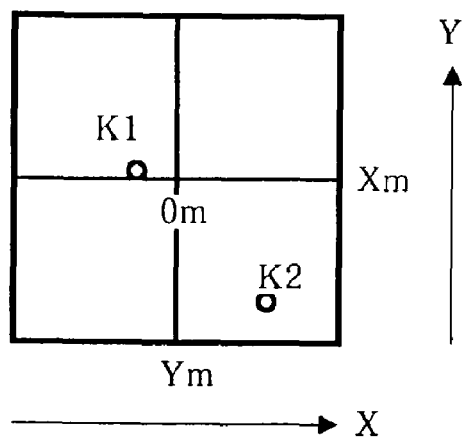

Next, the semiconductor laser device 2 is driven. The laser lights K1 and K2 emitted from the two stripes 9 and 10, respectively, pass through the light combining module 59 and enter an infrared camera (IR camera) 62 of the aligning device. The infrared camera 62 is connected to a monitor 63, making it possible to observe the positions of the spots of the laser lights K1 and K2 projected onto a virtual reference plane R that is perpendicular to the Z axis. The virtual reference plane R is set such that, in a later step where the first base 17 is fixed to the inside of the package 1 and the second lens 16 is fixed, a Z coordinate where the principal surface of the second lens 16 is positioned is included and that a center Om of the virtual reference plane R coincides with the center of the second lens 16 on the monitor screen as shown in FIG. 17B. (In the explanation here, axes that run through the center Om in parallel to the X axis and to the Y axis on the monitor screen are called an Xm axis and a Ym axis, respectively, for the sake of convenience).

The light combining module 59 gripped by the chuck 60 is moved along the X axis and the Y axis for rough positioning so that the positions of the two laser lights K1 and K2 are confirmed on the monitor screen.

(Second Step)

Next, the angle $\Psi$ of the light combining module 59 around the X axis is adjusted as shown in FIG. 18(A). As the light combining module 59 is rotated about the X axis, the laser lights K1 and K2 are refracted by the prism 5, the PBC 7, and others held in the light combining module 59. As a result, the laser lights K1 and K2 are moved in the same direction along the Ym axis on the monitor screen as shown in FIG. 18(B). In this step, the angle $\Psi$ of the light combining module 59 around the X axis is adjusted such that the distance from the Xm axis to the spot of one laser light is equal to the distance from the Xm axis to the spot of the other laser light.

(Third Step)

The light combining module 59 is then aligned in the Z-axis direction as shown in FIG. 19(A). As the light combining module 59 is moved in the Z-axis direction, the separation width D (see FIG. 2) of the laser lights K1 and K2 incident on the prism 5 is changed to cause the positions of the laser lights K1 and K2 in the output port 7c of the PBC 7 to move in the opposite directions from each other along the X axis. Accordingly, on the monitor screen, the laser lights K1 and K2 move in the opposite directions from each other along the Xm axis as shown in FIG. 19(B). In this step, the light combining module 59 is positioned in the Z-axis direction such that the Xm coordinate of one laser light coincide with the Xm coordinate of the other laser light on the monitor screen.

It is not always necessary in the third step for the two laser lights to be on the Ym axis after the positioning. This is because a slight shift in spot position of the two laser lights in the X-axis direction which may take place in this step can be compensated in a later step where the first base 17 is fixed to the interior of the package 1. However, if necessary, the shift in the X-axis direction may be corrected by moving the light combining module in the X-axis direction or by rotating the light combining module about the Y axis (the angle $\phi$).

(Fourth Step)

Next, the angle $\theta$ of the light combining module 59 around the Z axis is adjusted as shown in FIG. 20(A). The exit surfaces 5b of the prism 5 constitute nonvertical planes with respect to the central axis C1 of the approximately cylindrical circumferential surface of the holder member 14. Therefore, as the light combining module 59 is rotated about the Z axis, the incident angle of the two laser lights K1 and K2 with respect to the exit surfaces 5b is changed, and the two laser lights on the exit surfaces 5b are refracted in the opposite refraction directions from each other. Accordingly, the positions of the two laser lights K1 and K2 at the output port 7c of the PBC 7 are moved in the opposite directions from each other along the Y axis. In this step, the angle $\theta$ of the light combining module 59 around the Z axis is adjusted such that the two laser lights K1 and K2 overlap each other on the monitor screen (so that the Ym coordinates of the laser lights coincide with each other) as shown in FIG. 20(B).

Note that the second through fourth steps may be carried out in random order.

In this embodiment, the virtual reference plane R is set between the output port 7c of the PBC 7 and the optical fiber 8 to adjust the light combining module 59 in a manner that makes the two laser lights K1 and K2 overlap each other on the virtual reference plane R. Therefore, a slight shift in the exit direction between beams in the output port 7c of the PBC 7 is enlarged as a positional shift on the virtual reference plane R, which is set apart from the output port 7c, and accordingly can be detected with precision. The two laser lights thus can be matched in position and exit direction more accurately.

(Fifth Step)

Figure 21:
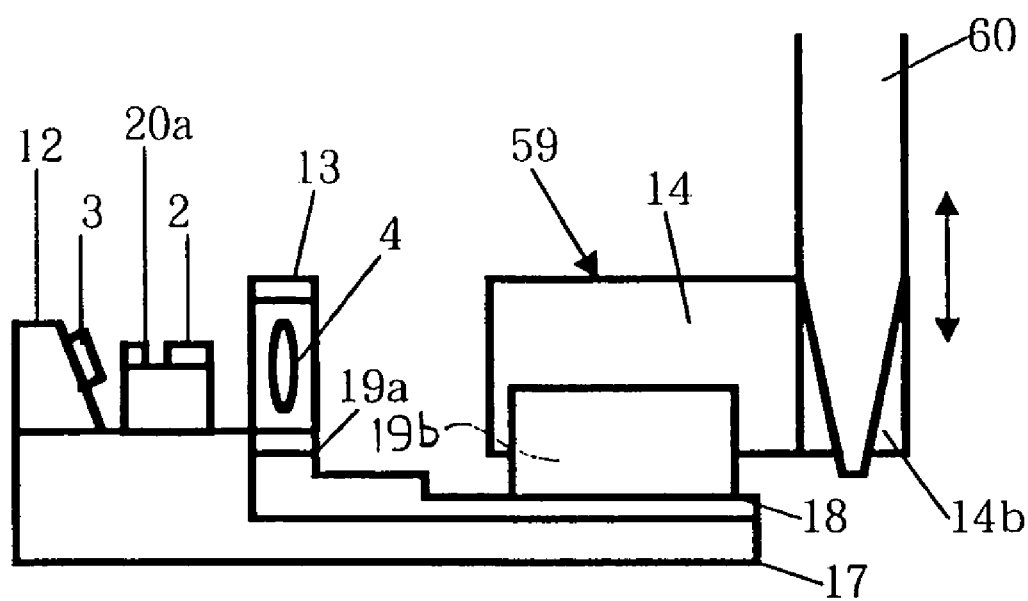
FIG. 21 is an explanatory diagram showing an alignment process and a fixation process of the polarization-synthesizing module.
Figure 2:
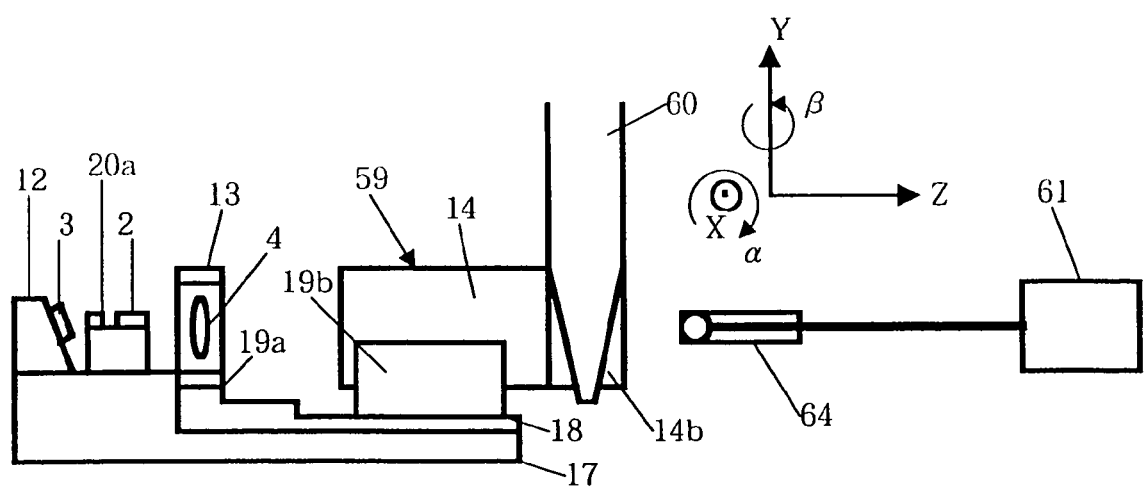

Information on the position of the light combining module 59 (X, Y, Z, $\theta$, $\Psi$, $\phi$) which is determined through the first through fourth steps is stored. Then, the light combining module 59 is retracted upward to set the second supporting member 19b on the second base 18. Once the second supporting member 19b is set in place, the light combining module 59 is returned to sit above the second base 18 as shown in FIG. 21. At this point, the second supporting member 19b is positioned so that the cylindrical circumferential surface of the light combining module 59 is fit between the two erect walls 19b2 in the way the position information (X, Y, Z, $\theta$, $\Psi$, $\phi$) of the light combining module 59 dictates.

(Sixth Step)

Next, a dummy fiber (fiber with a lens) 64 for positioning is placed in a position where synthesized light from the output port 7c of the PBC 7 can be received as shown in FIG. 22. Consulting the reading of a power meter 61, which is connected to the other end of the dummy fiber 64, the dummy fiber 64 is positioned in the X-axis, Y-axis and Z-axis directions and in directions about the X axis (the angle $\alpha$) and the Y axis (the angle $\beta$) such that the maximum amount of synthesized light is coupled to the dummy fiber 64.

(Seventh Step)

Figure 23:
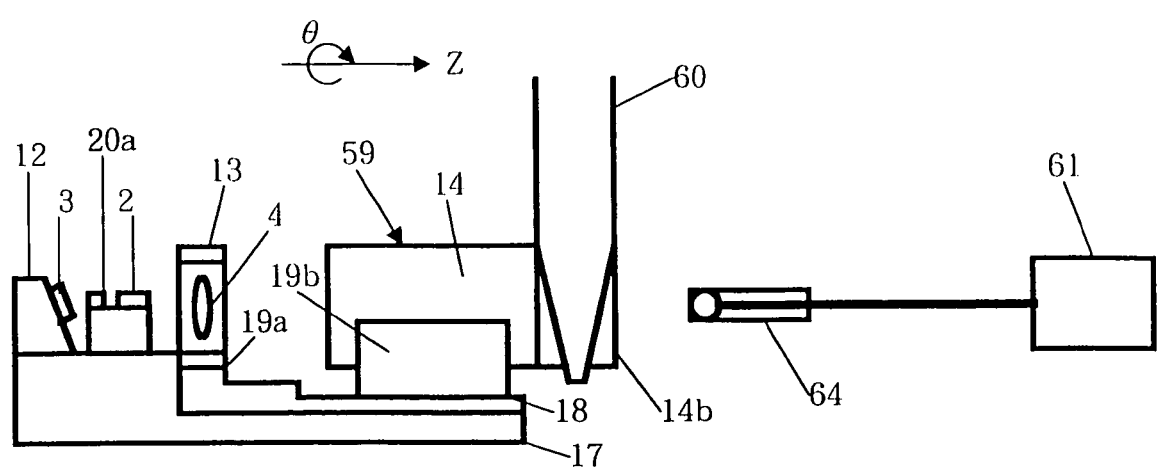
FIG. 23 is an explanatory diagram showing an alignment process and a fixation process of the polarization-synthesizing module.

After the dummy fiber 64 is positioned, the position of the light combining module 59 is adjusted in the Z-axis direction and in a direction about the Z axis (the angle $\theta$) as shown in FIG. 23, so that the maximum amount of synthesized light is coupled to the dummy fiber 64.

Through the sixth and seventh steps, the position of the light combining module 59 at which the maximum amount of synthesized light is coupled to the dummy fiber 64 is determined. The sixth and seventh steps may be omitted if the infrared camera used in the second through fourth steps has enough resolution to make the two laser lights K1 and K2 coincide in position with each other with precision.

(Eighth Step)

Figure 24:
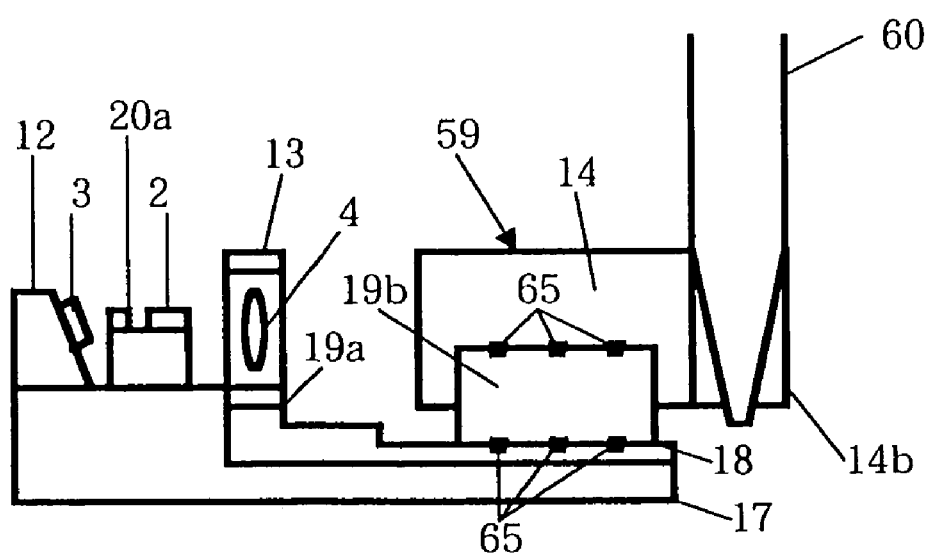
FIG. 24 is an explanatory diagram showing an alignment process and a fixation process of the polarization-synthesizing module.

Lastly, as shown in FIG. 24, the second supporting member 19b is fixed by YAG laser welding to the top of the second base 18 at the position determined through the above steps. Then, the cylindrical circumferential surface of the holder member 14 of the light combining module 59 is fixed to the erect walls 19b2 of the second supporting member 19b. The light combining module 59 is thus fixed to the top of the second base 18.

As has been described, in the semiconductor laser module M1 of this embodiment, the light combining element (PBC) 7 is held in the holder member 14 with an approximately cylindrical circumferential surface whose central axis C1 is positioned approximately parallel to the axial direction of the optical fiber 8 (the Z-axis direction in FIGS. 1) to serve as the light combining module 59, and the second supporting member 19b is provided to support and fix the light combining module 59 after moving the light combining module 59 for positioning at least to rotate about an axis extended from the axis of the optical fiber 8 (the angle $\theta$).

Therefore, if the semiconductor laser device 2 or the first lens 4 is fixed in a wrong posture making the plane that is defined by the optical axes of the laser lights K1 and K2 unparallel to the mount surface of the base (the first base 17 or the second base 18), the misalignment can be individually corrected by rotating the light combining module 59 about an axis extended from the axis of the optical fiber 8, and the light combining module 59 can be fixed to the top of the second base 18 through the second supporting member 19b with the two laser lights K1 and K2 made coincide in spot position and exit optical axis with each other in the output port 7c of the PBC 7.

In addition, the semiconductor laser module M1 is capable of polarizing the two laser lights K1 and K2 in a given direction before the laser lights enter the input ports 7a and 7b of the PBC 7 to thereby avoid polarization split in the PBC 7.

In this embodiment, the approximately cylindrical circumferential surface of the light combining module 59, which is aligned in various directions including a direction about the Z axis (in the direction of the angle θ), is supported and fixed between the two erect walls 19b2 of the second supporting member 19b, which substantially takes a U-shape in section and which has the bottom plate 19b1 to be joined to the second base 18 and the two erect walls 19b2 standing on the ends of the bottom plate 19b1 in parallel to each other. With this structure, whatever positions in the X-axis, Y-axis and Z-axis directions and whatever angles about these axes (Ψ, φ, θ) the light combining module 59 is in as a result of the alignment, the second supporting member 19b can flexibly adapt to the way the light combining module 59 is aligned and can support the light combining module 59 by adjusting the position of the second supporting member 19b on the second base 18 such that the approximately cylindrical circumferential surface of the light combining module 59 is fit between the two erect walls 19b2 of the second supporting member 19b.

Accordingly, even if the thickness of solder for fixing the semiconductor laser device 2, is not uniform or the first lens 4 is YAG laser-welded at a wrong position making the plane that is defined by the optical axes of the laser lights K1 and K2 emitted from the semiconductor laser device 2 unparallel to the mount surface of the second base 18, the two laser lights can be matched in position and exit direction at the output port 7c of the PBC 7 by aligning the light combining module 59 appropriately. In this embodiment where a polarized wave synthesizing element (PBC 7) is used as the light combining element, polarization split of the two laser lights K1 and K2 in the PBC 7 can be avoided and accordingly lowering in intensity of the synthesized light is prevented. Therefore, synthesized light of high power and low degree of polarization can be obtained from the optical fiber 8 without fail.

The second supporting member 19b in this embodiment has the bottom plate 19b1, which is to be joined to the second base 18, and the two erect walls 19b2, which stand on the ends of the bottom plate 19b1 in parallel to each other, to have a U-shape in section. Alternatively, the bottom plate 19b1 that is to be joined to the second base 18 may be omitted, and the two erect walls 19b2 may be formed directly on the second base 18. In this case also, the light combining module 59 can be aligned in the direction Z, the direction θ (a direction about the Z axis), and the direction Ψ (a direction about the X axis). This structure can sufficiently provide the effects of the present invention when there is more tolerance for alignment in the direction X and the direction φ.

In this embodiment, the light combining module 59 is positioned in the first through fourth steps, and then the second supporting member 19b is fit in. It is also possible to move the light combining module 59 for alignment after the holder member 14 of the light combining module 59 is fit between the erect walls 19b2 of the second supporting member 19b in the first step. In this case, alignment in the Y direction, the Z direction, around the Z axis (the angle θ), and around the X axis (the angle Ψ) is achieved by moving the light combining module 59 between the two erect walls 19b2, whereas alignment in the X direction and around the Y axis (the angle φ) is achieved by moving the light combining module 59, along with the second supporting member 19b, in the direction X and around the Y axis (the angle φ) with the holder member 14 fit between the two erect walls 19b2.

The first base 17 to which the light combining module 59 is fixed in the manner described above is positioned such that laser light exiting the output port 7c of the PBC 7 passes through the center of the flange portion 1a, and is fixed by solder to the top of the cooling device 20, which is fixed in advance onto the bottom plate of the package 1.

Then, the semiconductor laser device 2 and the monitor photodiode 3 are electrically connected to a lead (not shown) of the package 1 through a gold wire (not shown).

Next, a lid 1c is placed on the package 1 in an inert gas (for example, $N_2$ or Xe) atmosphere, and the package is sealed airtightly by resistance welding of the perimeter of the lid.

Next, the second lens 16 is aligned within the XY plane in the Z-axis direction with respect to the flange portion 1a of the package 1, and fixed. In this step, first, the second lens holder member 21 inserted in a slide ring 1d is moved on an end face of the flange portion 1a, and the slide ring 1d is welded to the end of the flange portion 1a by YAG laser welding at a position where exit light from the second lens 16 becomes parallel to the central axis of the flange portion 1a of the package 1 (parallel to the Z axis). Then, while monitoring the spreading angle of the exit light from the second lens 16, the second lens holder member 21 is moved in the Z-axis direction to position the second lens holder member 21 in the Z-axis direction such that the spreading angle is approximately equal to a light receiving angle (NA) of the optical fiber 8. At this position, the second lens holder member 21 and the slide ring 1d are welded by YAG laser welding.

Lastly, the optical fiber 8 is aligned and fixed. In this step, while the ferrule 23 is inserted in the slide ring 22, the ferrule 23 is held by a ferrule aligning hand 63, and in this state the ferrule 23 and the slide ring 22 are aligned within the plane perpendicular to the optical axis of the optical fiber 8 (within the XY plane) and in the direction of the optical axis of the optical fiber 8 (the Z direction) such that the amount of the light coupled to the optical fiber 8 reaches the maximum.

After positioning the optical fiber 8 in this manner is completed, the ferrule 23 is fixed by YAG laser welding at the set position inside the slide ring 22. Then, the slide ring 22 and the second lens holder member 21 are fixed at the interface therebetween by YAG laser welding. This completes alignment and fixation of the optical fiber 8.

Figure 9:
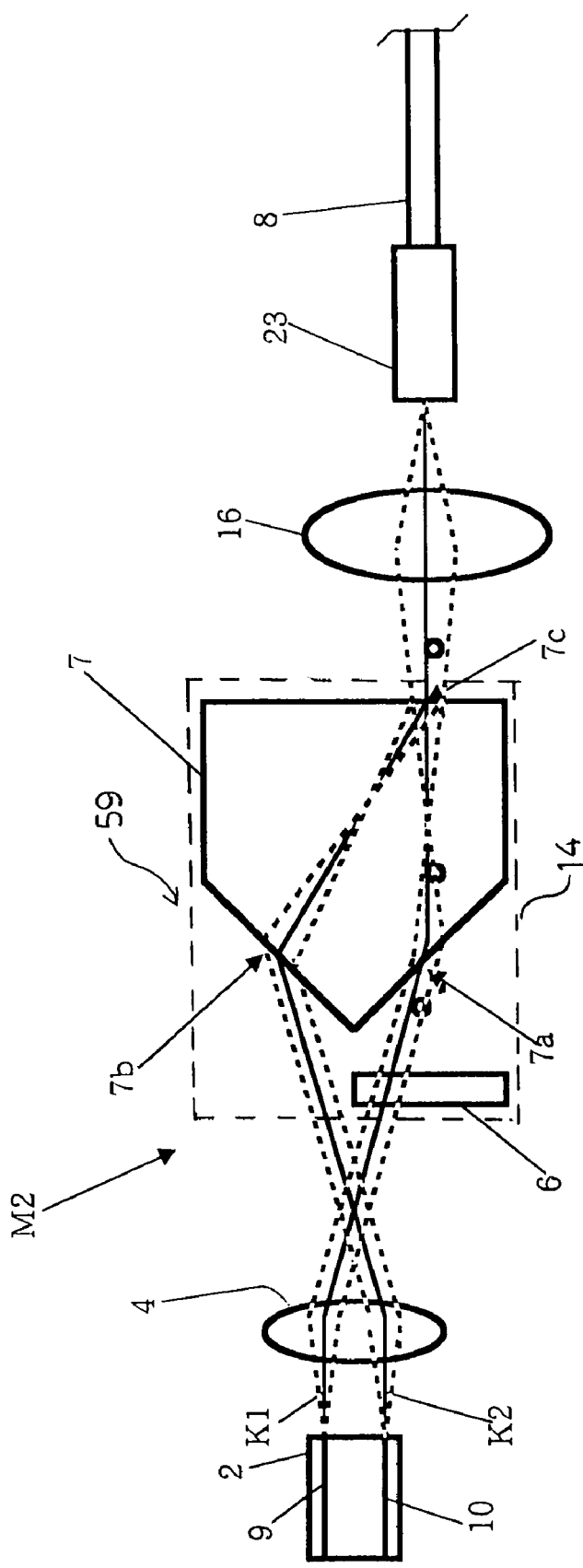
FIG. 9 is an explanatory diagram schematically showing a configuration of a modified example of the semiconductor laser module in accordance with the embodiment of the present invention.

A semiconductor laser module of the present invention is not limited to the structure described above and, for instance, may be formed like a semiconductor laser module M2 shown in FIG. 9. In FIG. 9, the first laser light K1 and the second laser light K2 which are not parallel to each other enter the PBC 7, and the incident surfaces of the PBC 7 are slanted with a wedge-like shape so that the first laser light K1 as an ordinary ray is propagated in the axis line direction of the optical fiber 8, whereas the second laser light K2 as an extraordinary ray exits the output port 7c of the PBC 7 in the axis line direction of the optical fiber 8 together with the first laser light K1.

Figure 10:
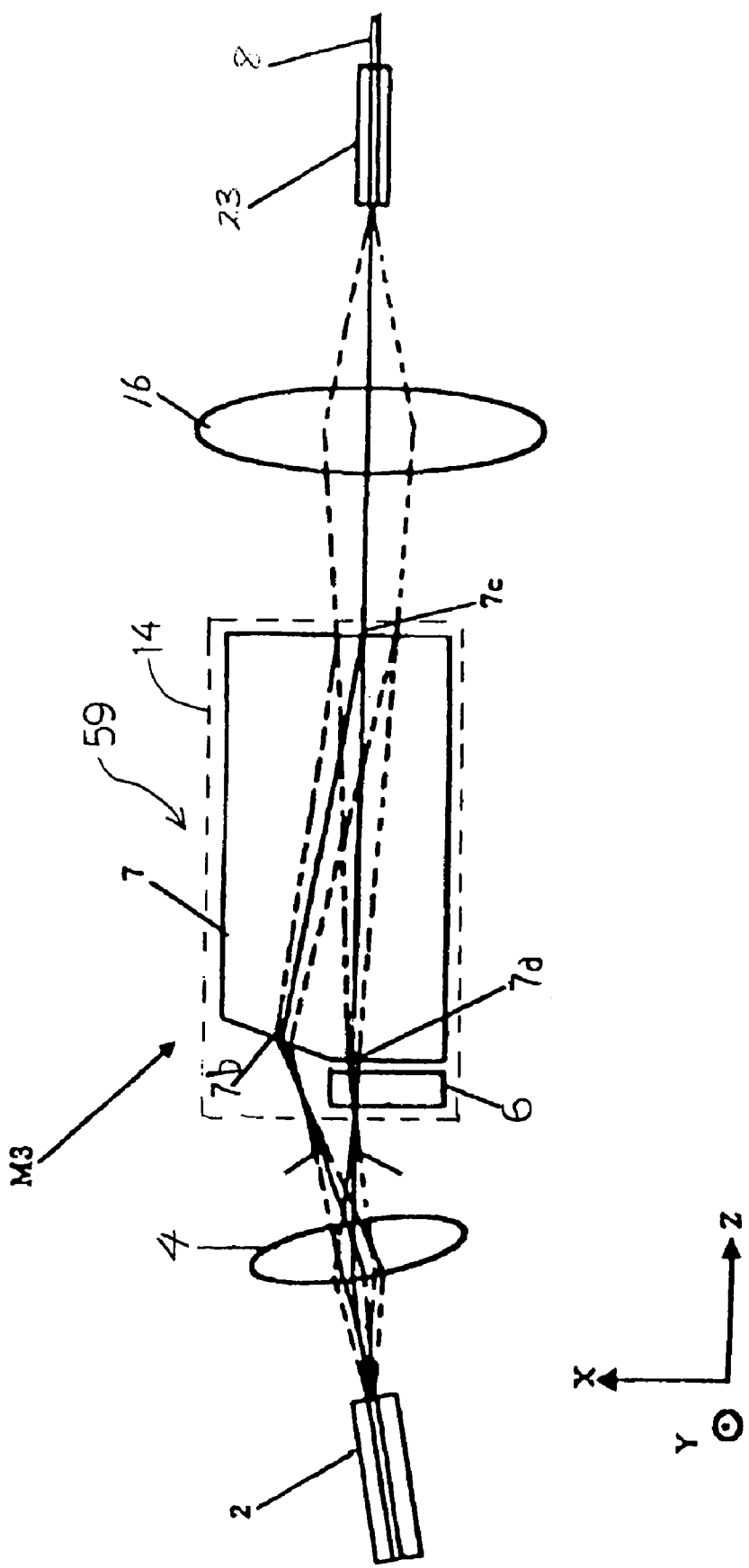
FIG. 10 is an explanatory diagram schematically showing a configuration of a modified example of the semiconductor laser module in accordance with the embodiment of the present invention.

Also, the semiconductor laser module of the present invention may be formed like a semiconductor laser module M3 shown in FIG. 10. In FIG. 10, central axes of the first lens 4 and the semiconductor laser device 2 may be slanted to be placed at a given angle with respect to the axis line of the optical fiber 8 so that the first laser light K1 is propagated in the axis line direction of the optical fiber 8 after exiting the first lens 4. At the same time, the second input port 7b of the PBC 7 may be slanted with respect to the first input port 7a so that the second laser light K2 as an extraordinary ray exits the output port 7c of the PBC 7 in the axis line direction of the optical fiber 8 together with the first laser light K1.

Figure 11:
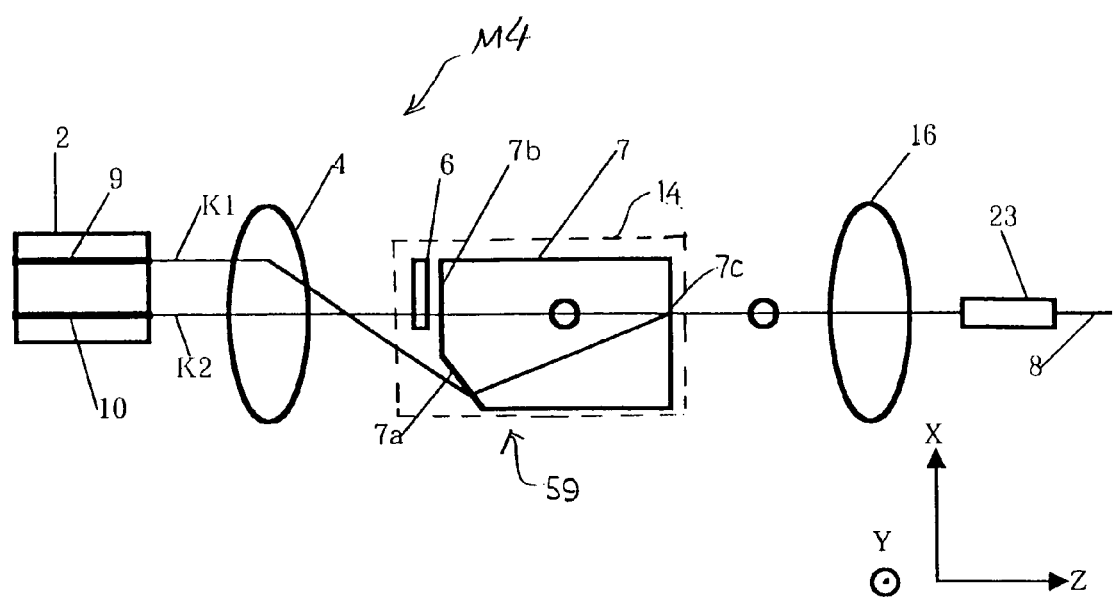
FIG. 11 is an explanatory diagram schematically showing a configuration of a modified example of the semiconductor laser module in accordance with the embodiment of the present invention.

Also, a semiconductor laser module of the present invention may be formed like a semiconductor laser module M4 shown in FIG. 11. In FIG. 11, the first lens 4 is arranged such that the second laser light K2 is transmitted through the first lens at approximately the center of the first lens, and the first input port 7a is slanted with respect to the second input port 7b so that the second laser light K2 is propagated in the axis line direction of the optical fiber 8 and the first laser light K1 exits the output port 7c in parallel to the axis line direction of the optical fiber 8 together with the second laser light K2.

In the semiconductor laser modules M2 through M4 structured as described above, there is no need to place the prism 5 between the half-wave plate 6 and the first lens 4. This provides a simpler structure and the length in the optical axis direction of the semiconductor laser module can be shortened. Accordingly, the optical output characteristic is less affected by warping of the package in a high temperature environment.

Figure 12:
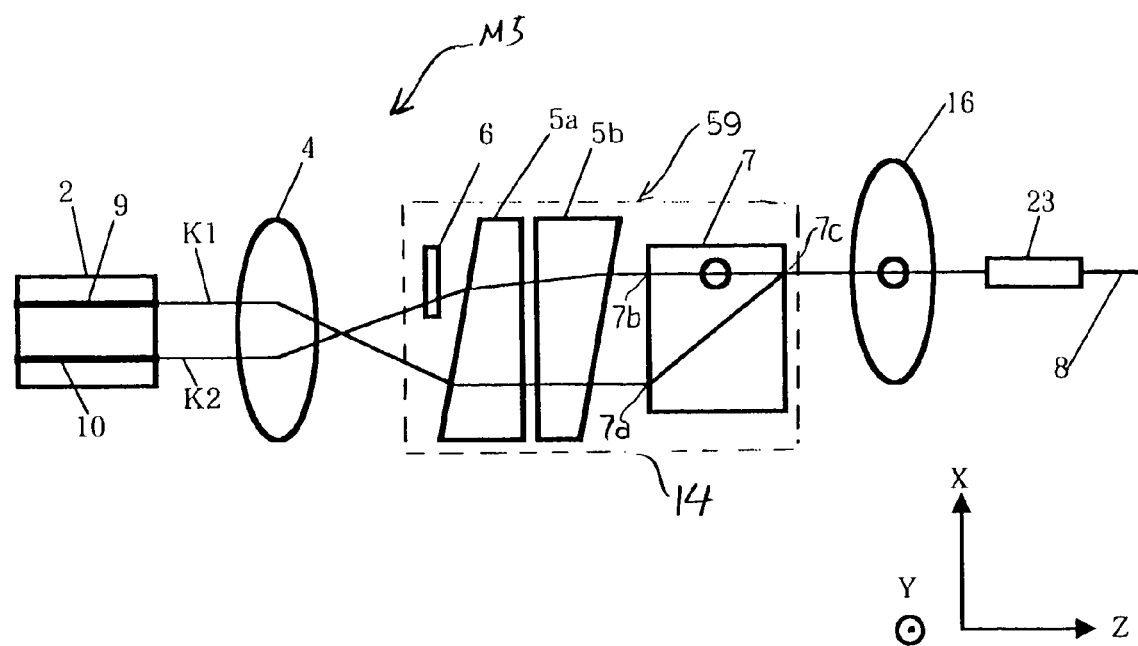
FIG. 12 is an explanatory diagram schematically showing a configuration of a modified example of the semiconductor laser module in accordance with the embodiment of the present invention.

A semiconductor laser module of the present invention may also be formed like a semiconductor laser module M5 shown in FIG. 12. In FIG. 12, plural (two in FIG. 12) wedge-shaped prisms 5a and 5b are placed in the optical axis direction to make the two laser lights K1 and K2 parallel to each other after the laser lights exit the first lens 4. In this embodiment, the two laser lights K1 and K2 can be made parallel to each other with precision.

Similar to the semiconductor laser module M1, the semiconductor laser modules M2 through M5 structured as above are capable of matching the two laser lights in position and exit direction in the output port 7c of the PBC 7 by aligning the light combining module 59, which holds the PBC 7, appropriately. In addition, these embodiments where a polarized wave synthesizing element (PBC 7) is used as the light combining element are capable of avoiding polarization split of the two laser lights K1 and K2 in the PBC 7 and accordingly can prevent lowering in intensity of the synthesized light. Therefore, synthesized light of high power and low degree of polarization can be obtained from the optical fiber 8 without fail.

Figure 7:
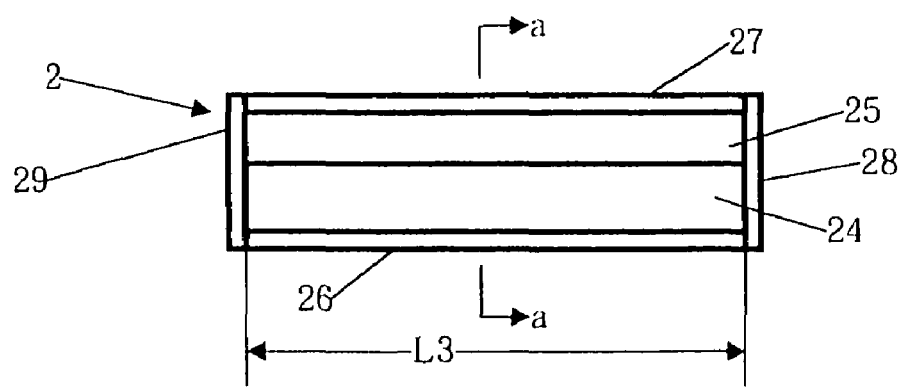
Figure 7:
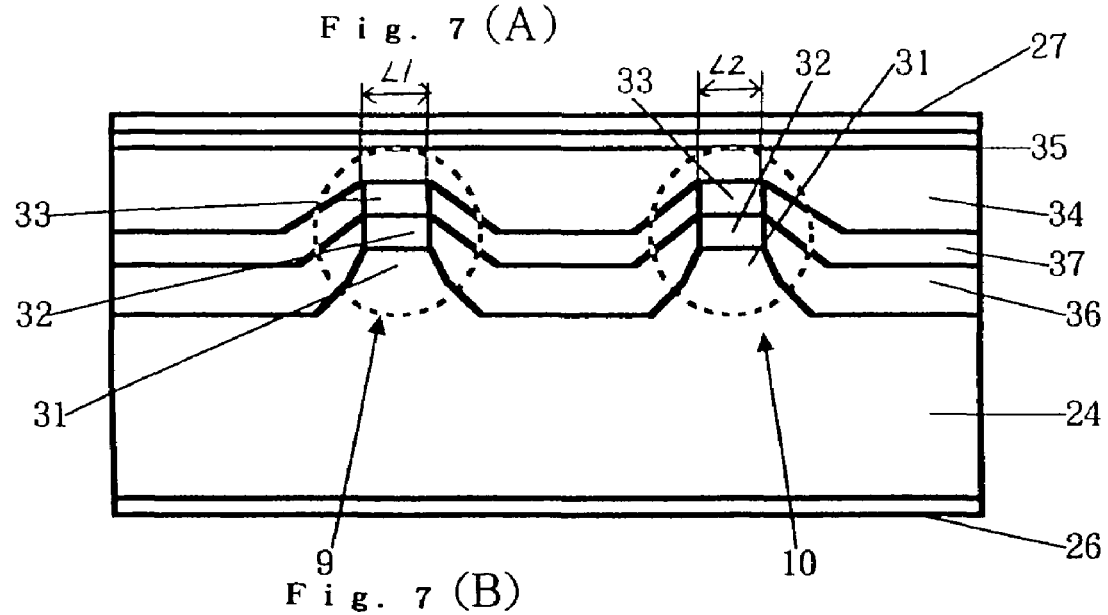
Figure 8:
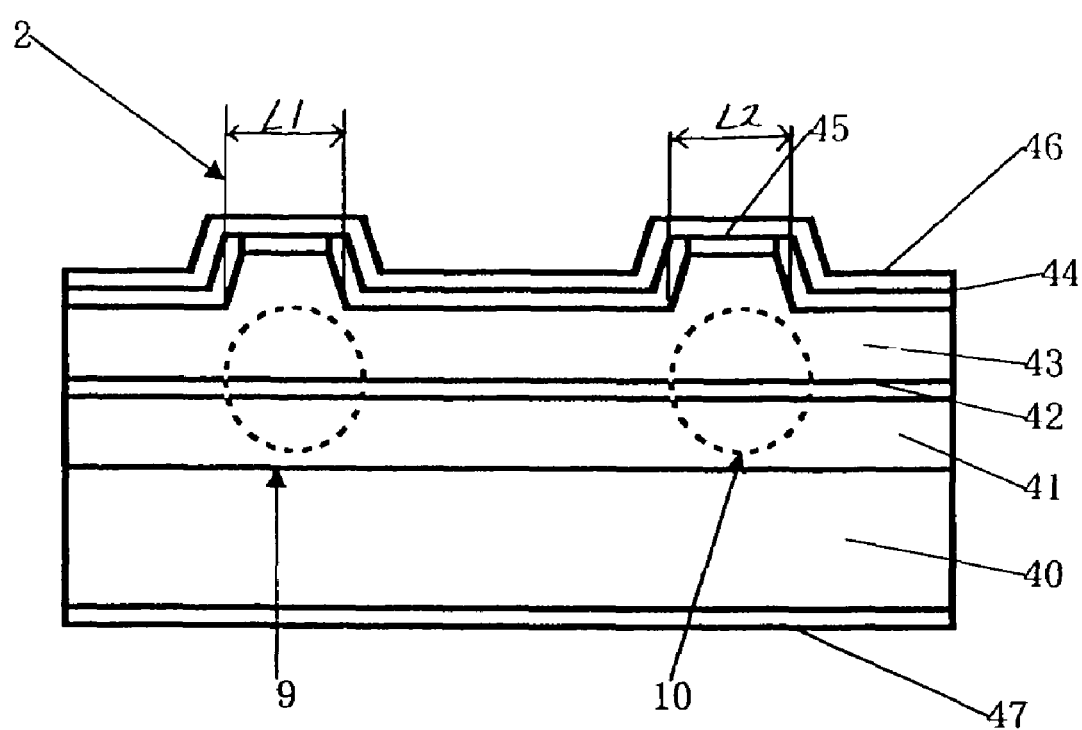
FIG. 8 is an explanatory diagram showing another example of the semiconductor laser device.

Now, a description is given on the semiconductor laser device 2 used in a semiconductor laser module according to an embodiment of the present invention. FIGS. 7(A) and 7(B) are explanatory diagrams for illustrating a structure of the semiconductor laser device 2 used in a semiconductor laser module of the present invention. FIG. 8 is an explanatory diagram showing another example of the semiconductor laser device 2. FIG. 7(B) is a sectional view taken along the line a—a of FIG. 7(A).

The semiconductor laser device 2 has a structure shown in FIG. 7(A). In FIG. 7(A), a laminate structure 25, which will be described later, is formed on a substrate 24 of a given semiconductor through epitaxial crystal growth of a given semiconductor by a known epitaxial growth method such as organic metal vapor phase growth, the liquid phase method, molecular beam epitaxy, or gas source molecular beam epitaxy. After that, a lower electrode 26 is formed on the bottom face of the substrate 24, and an upper electrode 27 is formed on the top of the laminate structure 25. A given resonator length L3 is obtained by cleaving, and a low reflection film 28 (having a reflectivity of 5% or less, for example) is formed on one of the cleaved surfaces (the front end face 2a) whereas a high reflection film 29 (having a reflectivity of 90% or more, for example) is formed on the other cleaved surface (the rear end face 2b).

As shown in FIG. 7(B), the laminate structure 25 on the substrate 24 is, for example, a BH structure (Buried Heterostructure). To give an example, an n-InP clad layer 31, an active layer 32 of GRIN-SCH-MQW (Graded Index Separate Confinement Heterostructure Multi Quantum Well) formed from a GaInAsP multilayer film, and a p-InP clad layer 33 are layered in order on the substrate 24 formed of InP. A buried layer 34 formed of, for example, p-InP and a cap layer 35 formed of, for example, p-GaInAsP are layered on the p-InP clad layer 33. The upper electrode 27 is formed on the cap layer 35, and the lower electrode 26 is formed on the bottom face of the substrate 24.

The lower n-InP clad layer 31, the active layer 32 and the p-InP clad layer 33 are processed to form two stripes which are parallel to each other across a gap of 40 to 60 μm. A p-InP blocking layer 36 and an n-InP blocking layer 37 are layered in this order beside the stripes, thereby forming a narrow portion for injecting current to the active layer 32.

From the viewpoint of increasing output, it is advantageous for the active layer 32 to employ a compressive strain quantum well structure that sets the lattice mismatch rate with respect to the substrate 24 to 0.5% or more and 1.5% or less and a multiple quantum well structure having about five wells. If a barrier layer of the strain quantum well structure has a strain compensation structure in which tensile strain opposite to the strain of a well layer is introduced, the lattice match condition is met equivalently. Therefore, the well layer may have a higher degree of lattice mismatch.

In this embodiment, the light emission portions composed of the lower n-InP clad layer 31, the GRIN-SCH-MQW active layer 32, and the p-InP clad layer 33 extend in the direction perpendicular to the paper surface of FIG. 7(B) forming a stripe pattern, and are referred to as the stripe 9 and the stripe 10.

The semiconductor laser device 2 is adhered on the upper electrode 27 side to the heat sink 58 shown in FIG. 1(B) by solder using Au—Sn or the like. Upon receiving a current supplied from the external through the upper electrode 27 (the p side in this embodiment) and the lower electrode 26 (the n side in this embodiment), the two stripes simultaneously start laser oscillation and the two exit lights from the low reflection film 28 are combined by the above-mentioned PBC 7 and used for a desired purpose.

If the two stripes have completely identical characteristics, the threshold current of the semiconductor laser device 2 according to this embodiment is twice larger than when there is only one stripe, and the total light output is twice the light output of a semiconductor laser device that has one stripe. In other words, when driven with a current approximately twice the current for driving one stripe, the semiconductor laser device 2 produces in total approximately twice larger light output, and the slope efficiency of the semiconductor laser device 2 is equal to that of when there is one stripe.

In the example described above, the semiconductor laser device 2 has an InP-based BH structure. Another example is shown in FIG. 8 in which the semiconductor laser device 2 is of GaAs-based ridge waveguide type. The semiconductor laser device 2 shown in FIG. 8 has two ridge portions by layering an n type lower clad layer 41, an active layer 42, a p type upper clad layer 43, an insulating layer 44, and a p-GaAs layer 45 on a substrate 40 formed of n-GaAs. An upper electrode (p electrode) 46 is formed on the insulating layer 44 and the p-GaAs layer 45. A lower electrode (n electrode) 47 is formed on the bottom face of the substrate 40.

The ridge portions extend in the direction perpendicular to the paper surface of FIG. 8 forming a stripe pattern, and portions of the active layer 42 that are directly below the ridge portions emit light. The light emission portions are referred to as the stripes 9 and 10. It is also possible to form a ridge type LD from an InP-based material.

Figure 5:
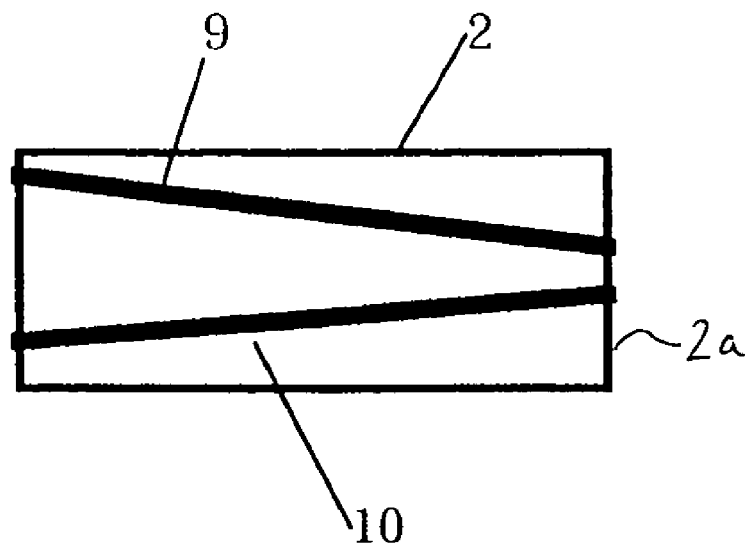
FIG. 5 is an explanatory diagram showing a modified example of the semiconductor laser device in accordance with the embodiment of the present invention.

The first and second stripes 9 and 10 of the semiconductor laser device 2 described above are formed extending in parallel to each other in the longitudinal direction. The first and second stripes 9 and 10 may, however, for instance, be formed obliquely as shown in FIG. 5 without being limited to the parallelism. Referring to FIG. 5, the right side is a direction in which the laser lights are emitted, and the space between the stripes 9 and 10 becomes narrower as it gets closer to the right side edge. In this case, the two first and second laser lights K1 and K2 emitted from the two stripes 9 and 10 intersect each other at a comparatively short distance from the semiconductor laser device 2, and, after traveling through the first lens 4, split sufficiently for the half-wave plate 6 to be inserted to the optical path of the first laser light K1 alone (which implies that a divergent width D' becomes sufficiently large in FIG. 2). Therefore, a required propagation distance (L in FIG. 2) decreases, and hence the length of the semiconductor laser module M in the optical-axis direction can be reduced.

The propagation length L can be shortened also by taking the reverse method to FIG. 5 and increasing the gap between the stripes 9 and 10 progressively toward the right side.

Second Embodiment

FIG. 13 is a plan view showing a semiconductor laser module M6 according to a second embodiment of the present invention. As shown in FIG. 13, the semiconductor laser module M6 according to the second embodiment of the present invention includes: a first semiconductor laser device 94 for emitting a first laser light K1; a second semiconductor laser device 95 for emitting a second laser light K2; two first lenses 96a and 96b where the two laser light beams K1 and K2 emitted from the two semiconductor laser devices 94 and 95 are collimated, respectively; a light combining element (polarized wave synthesizing element (cube beam splitter)) 97; and a mirror 97a constituting a reflection surface that reflects the laser light K2 toward the light combining element 97.

In the second embodiment of the present invention, the light combining element 97, the mirror 97a, and a half-wave plate 6 are fixed to a holder member 14, which has an approximately cylindrical circumferential surface, to serve as a light combining module 59. The light combining module 59 is supported and fixed between two erect walls 19b2 of a second supporting member 19b, which substantially takes a U-shape in section and which has a bottom plate 19b1 to be joined to a second base 18 and the two erect walls 19b2 standing on the ends of the bottom plate 19b1 in parallel to each other. This structure makes it easier to align and fix the positions of the light combining element 97, the mirror 97a and the half-wave plate 6 in the X-axis, Y-axis, and Z-axis directions in FIG. 13 and in directions around the X axis (the angle $\Psi$), around the Y axis (the angle $\phi$), and around the Z axis (the angle $\theta$), so that the first laser light K1 incident on a first input port 97a of the light combining element 97 and the second laser light K2 incident on a second input port 97b together exit from an output port 97c in approximately the same direction while overlapping each other, and that the laser lights K1 and K2 are polarized in a given direction before entering the input ports 97a and 97b of the light combining element 97.

In short, whatever positions in the X-axis, Y-axis and Z-axis directions and whatever angles about these axes ($\Psi$, $\phi$, $\theta$) the light combining module 59 is in as a result of the positioning, the second supporting member 19b can flexibly adapt to the way the light combining module 59 is arranged and can support the light combining module 59 by adjusting the position of the second supporting member 19b on the second base 18 such that the approximately cylindrical circumferential surface of the light combining module 59 is fit between the two erect walls 19b2 of the second supporting member 19b.

Accordingly, even if the thickness of solder for fixing the semiconductor laser devices 94 and 95 is not uniform or the first lenses 96a and 96b are YAG laser-welded at a wrong position making the plane that is defined by the optical axes of the laser lights K1 and K2 emitted from the semiconductor laser devices 94 and 95 unparallel to the mount surface of the second base 18, the two laser lights K1 and K2 can be matched in position and exit direction at the output port of the light combining element 97 by aligning the light combining module 59 appropriately.

In addition, in this embodiment in which a polarized wave synthesizing element (cube beam splitter) is used as the light combining element 97, it is possible to avoid polarization split of the two laser lights K1 and K2 in the light combining element 97 and accordingly lowering in intensity of the synthesized light can be prevented. Therefore, synthesized light of high power and low degree of polarization can be obtained from the optical fiber 8 without fail.

Third Embodiment

Figure 14A:
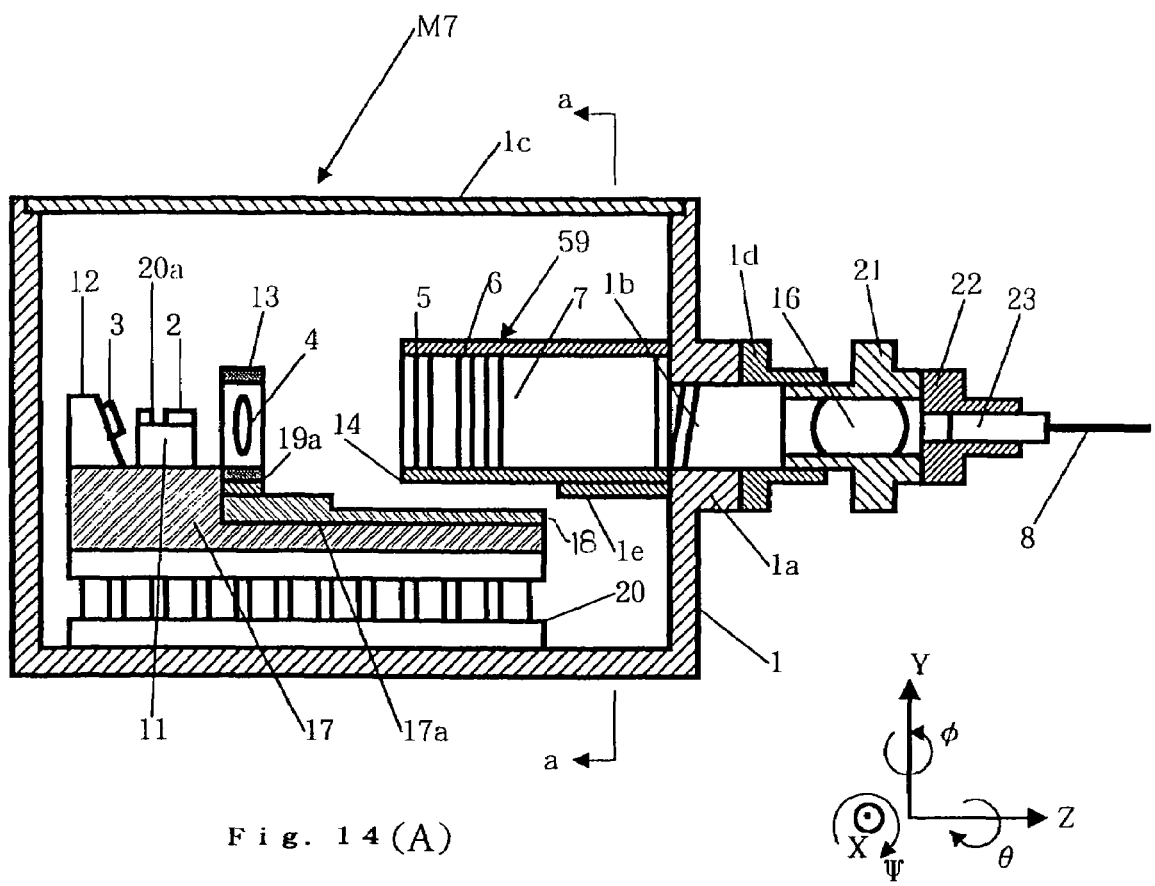
FIG. 14(A) is a side sectional view showing a semiconductor laser module according to a third embodiment of the present invention.
Figure 14B:
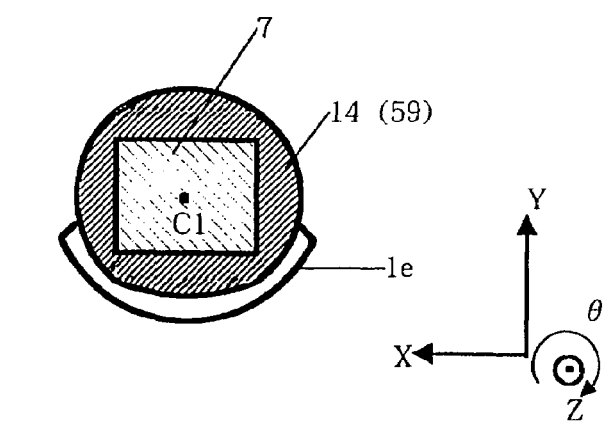
FIG. 14(B) is a sectional view taken along the line a—a of FIG. 14(A)

FIG. 14(A) is a side sectional view showing a semiconductor laser module M7 according to a third embodiment of the present invention, and FIG. 14(B) is a sectional view taken along the line a—a of FIG. 14(A).

The light combining module 59 in the first or second embodiment is fixed onto the second base 18 through the second supporting member 19b, which substantially takes a U-shape in section. In the third embodiment, the package 1 has a supporting member 1e which is fixed in advance around the window portion 1b and whose inner circumferential surface has the same shape as the outer circumferential surface of the holder member 14. The holder member 14 of the light combining module 59 is fixed along the inner circumferential surface of the supporting member 1e. For the rest, the third embodiment has a structure similar to the first embodiment. The position of the light combining module 59 in the third embodiment can be adjusted along the inner circumferential surface of the supporting member 1e in the axial direction of the optical fiber 8 (the Z-axis direction) and around an axis extended from the axis of the optical fiber 8 (the angle $\theta$).

Accordingly, even if the thickness of solder for fixing the semiconductor laser device 2, is not uniform or the first lens 4 is YAG laser-welded at a wrong position making the plane that is defined by the optical axes of the laser lights K1 and K2 emitted from the semiconductor laser device 2 unparallel to the mount surface of the second base 18, the two laser lights K1 and K2 can be matched in position and exit direction at the output port 7c of the PBC 7 by aligning the light combining module 59 in a direction about the axis of the optical fiber 8 (the angle θ) and/or in the axial direction of the optical fiber 8 appropriately. In addition, when the light combining element 7 is a polarized wave synthesizing element, this embodiment is capable of avoiding polarization split of the two laser lights K1 and K2 in the light combining element 7 and accordingly can prevent lowering in intensity of the synthesized light. Therefore synthesized light of high power and low degree of polarization can be obtained from the optical fiber 8 without fail.

Fourth Embodiment

FIG. 25 is a plan view showing a semiconductor laser module according to a fourth embodiment of the present invention.

A semiconductor laser module M8 according to the fourth embodiment includes: a semiconductor laser device 98 which is an array laser equipped with a first stripe 98a and a second stripe 98b that are parallel to each other across a gap of about 500 μm; a first lens 99a for collimating a first laser light K1 that is emitted from the first stripe 98a; and a second lens 99b for collimating a second laser light K2 that is emitted from the second stripe 98b.

Similar to the first embodiment, in the fourth embodiment of the present invention, a light combining element (PBC) 7 is held in a holder member 14 having an approximately cylindrical circumferential surface whose central axis C1 is positioned approximately parallel to the axial direction of an optical fiber 8 (the direction Z in FIG. 25), to serve as a light combining module 59. The light combining module 59 is supported and fixed by a second supporting member 19b after the second supporting member 19b moves the light combining module 59 for positioning at least to rotate around an axis extended from the axis of the optical fiber 8 (an angle θ).

In this embodiment, the approximately cylindrical circumferential surface of the light combining module 59, which is aligned in various directions including a direction about the Z axis (in the direction of the angle θ), is supported and fixed between two erect walls 19b2 of the second supporting member 19b, which substantially takes a U-shape in section and which has a bottom plate 19b1 to be joined to a second base 18 and the two erect walls 19b2 standing on the ends of the bottom plate 19b1 in parallel to each other. With this structure, whatever positions in the X-axis, Y-axis and Z-axis directions and whatever angles about these axes (Ψ, φ, θ) the light combining module 59 is in as a result of the alignment, the second supporting member 19b can flexibly adapt to the way the light combining module 59 is aligned and can support the light combining module 59 by adjusting the position of the second supporting member 19b on the second base 18 such that the approximately cylindrical circumferential surface of the light combining module 59 is fit between the two erect walls 19b2 of the second supporting member 19b.

Accordingly, even if the thickness of solder for fixing the semiconductor laser device 98 is not uniform or the first lenses 99a and 99b are YAG laser-welded at a wrong position making the plane that is defined by the optical axes of the two laser lights K1 and K2 emitted from the semiconductor laser device 98 unparallel to the mount surface of the second base 18, it is possible to avoid polarization split of the two laser lights K1 and K2 due to the PBC 7 and accordingly lowering in intensity of the synthesized light can be prevented. Therefore synthesized light of high power and low degree of polarization can be obtained from the optical fiber 8 without fail.

The fourth embodiment uses as a semiconductor laser device an array laser that has two stripes 98a and 98b (the gap between the stripes is about 500 μm). However, two semiconductor laser devices may be arranged parallel to each other across a narrow gap. The first lens may be a lens array.

A polarized wave synthesizing module holding a polarized wave synthesizing element is used as the light combining module 59 in the first through fourth embodiments. However, it is obvious that the same effects can be obtained even when a wavelength multiplexing module holding a wavelength multiplexing element is used, except the effect of preventing polarization split.

According to the present invention, a light combining element is held in a holder member having an approximately cylindrical circumferential surface whose central axis is positioned approximately parallel to the axial direction of an optical fiber to serve as a light combining module, which is rotated for alignment about at least the central axis before being supported and fixed. With this structure, alignment can be made such that plural laser lights, which are to be combined at an output port of the light combining element, coincide in position and exit direction with one another. Therefore, if a semiconductor laser device or a lens is fixed in a wrong posture making a plane that is defined by optical axes of plural laser lights unparallel to a mount surface of a base, the misalignment can be individually corrected, and the light combining module can be aligned such that spot positions and exit optical axes of plural laser lights which are combined in the output port of the light combining module coincide with one another.

In addition, when the light combining element is a polarized wave synthesizing element, positioning can be made to polarize two laser lights in a given polarization direction before the laser lights enter the light combining element. Therefore polarization split in the light combining element can be avoided, and a high power semiconductor laser module is provided.

What is claimed is:
1. A semiconductor laser module comprising:
a first stripe and a second stripe formed on a semiconductor substrate, said first stripe and said second stripe configured to emit respectively a first laser beam and a second laser beam;
at least one first lens positioned so that the first laser beam and the second laser beam are incident thereon;
a substrate having a mounting surface on which the semiconductor substrate is mounted;
an optical synthesizing module including
an optical synthesizing element having a first input part on which the first laser beam is incident, a second input part on which the second laser beam is incident, and an output part from which the first laser beam emerging from the first input part and the second laser beam emerging from the second input part are emitted, and a holder member configured to hold the optical synthesizing element and having at least partially substantially columnar peripheral outer surface around a center axis thereof;

a supporting member configured to support said optical synthesizing module at the columnar peripheral surface of the holder member, said supporting member including a bottom plate joined to said substrate and two mutually parallel upright walls provided perpendicularly on both lateral ends of the bottom plate, the two upright walls being parallel to the center axis of the optical synthesizing module; and an optical fiber configured to receive a laser beam emerging from the output part of the optical synthesizing element, wherein said optical synthesizing module is fixed to said supporting member in a state that the columnar peripheral surface of the holder member is placed between the two upright walls of said supporting member, and such that the first laser beam emerging from the first input part and the second laser beam emerging from the second input part are combined and emitted as a combined laser beam from the output part generally along the center axis of the holder member.

2. A semiconductor laser module comprising:

a first stripe and a second stripe formed on a semiconductor substrate, said first stripe and said second stripe configured to emit respectively a first laser beam and a second laser beam;

at least one first lens positioned so that the first laser beam and the second laser beam are incident thereon;

a substrate having a mounting surface on which the semiconductor substrate is mounted;

an optical synthesizing module including an optical synthesizing element having a first input part on which the first laser beam is incident, a second input part on which the second laser beam is incident, and an output part from which the first laser beam emerging from the first input part and the second laser beam emerging from the second input part are emitted, and a holder member configured to hold the optical synthesizing element and having at least partially substantially columnar peripheral surface around a center axis thereof;

a supporting member configured to support said optical synthesizing module at the columnar peripheral surface of the holder member, said supporting member including two upright walls provided on said substrate, the two upright walls being perpendicular to said substrate and parallel to the center axis of the optical synthesizing module, and wherein said optical synthesizing module is fixed to said supporting member in a state that the columnar peripheral surface of the holder member is placed between the two upright walls of said supporting member, and such that the first laser beam emerging from the first input part and the second laser beam emerging from the second input part are combined and emitted as a combined laser beam from the output part generally along the center axis of the holder member.

3. The semiconductor laser module according to claim 1, wherein the holder member further comprises two flat upright inner surfaces on both sides of the center axis, the two flat surfaces being parallel to each other and to the center axis.

4. The semiconductor laser module according to claim 1, wherein the optical synthesizing element is a polarization synthesizing element.

5. The semiconductor laser module according to claim 4, wherein the optical synthesizing module further includes a polarization rotating element configured to rotate a polarization direction of at least one of the first laser beam and the second laser beam emerging from said at least one first lens, the polarization rotating element being held by the hold member.

6. The semiconductor laser module according to claim 1, wherein said first stripe and said second stripe are arrayed on a single semiconductor substrate with a spacing interposed therebetween to form a single semiconductor laser device.

7. The semiconductor laser module according to claim 6, wherein said at least one first lens consists of a single lens positioned so that the first laser beam and the second laser beam are incident thereon, said single lens being configured to deflect the first laser beam and the second laser beam.

8. The semiconductor laser module according to claim 7, wherein said first stripe and said second stripe are arranged with a spacing not more than 100 .mu.m.

9. The semiconductor laser module according to claim 6, further comprising a prism fixed to the holder member, said prism being positioned so that the first laser beam and the second laser beam emerging from said single lens are incident thereon and emitted toward the polarization synthesizing element along respective optical axes parallel to each other.

10. The semiconductor laser module according to claim 1, wherein said first stripe and said second stripe are formed on discrete semiconductor substrates to form discrete semiconductor laser devices.

11. The semiconductor laser module according to claim 10, further comprising a mirror configured to reflect one of the first laser beam and the second laser beam toward the optical synthesizing element said mirror being fixed to the holder member.

12. The semiconductor laser module according to claim 6, wherein said at least one first lens consists of two lenses on which the first laser beam and the second laser beam are respectively incident.

13. The semiconductor laser module according to claim 10, wherein said at least one first lens consists of two lenses on which the first laser beam and the second laser beam are respectively incident.

14. The semiconductor laser module according to claim 11, wherein said at least one first lens consists of two lenses on which the first laser beam and the second laser beam are respectively incident.

15. The semiconductor laser module according to claim 12, wherein said two lenses are formed in a lens array.

16. The semiconductor laser module according to claim 13, wherein said two lenses are formed in a lens array.

17. The semiconductor laser module according to claim 14, wherein said two lenses are formed in a lens array.

18. A manufacturing method of a semiconductor laser module, said method comprising:

aligning an optical synthesizing element such that beam spots of a first laser beam and a second laser beam emitted respectively from a first stripe and a second stripe formed on a semiconductor substrate overlap on an output part of the optical synthesizing element to be emitted as a combined laser beam therefrom;

fixing a substantially columnar peripheral outer surface of a holder member holding the optical synthesizing element around a center axis of the optical synthesizing element; and fixing a supporting member so as to support said optical synthesizing element at the substantially columnar peripheral outer surface of the holder member, said supporting member including a bottom plate joined to said substrate and two mutually parallel upright walls provided perpendicularly on both lateral ends of the bottom plate, the two upright walls being parallel to the center axis of the optical synthesizing element, wherein said optical synthesizing module is fixed to supporting member in a state that the columnar peripheral surface of the holder member is placed between the two upright walls of said supporting member.

19. The method according to a claim 18, wherein said aligning the optical synthesizing element includes adjusting a position of the optical synthesizing element at least one of along the center axis of the holder member, around the center axis of the holder member, and around a direction orthogonal to the center axis of the holder member and in parallel to a mounting surface on which the semiconductor substrate is mounted.

20. The method according to claim 18, wherein said aligning the optical synthesizing element includes adjusting a position of the optical synthesizing element such that the first laser beam and the second laser beam overlap on an imaginary reference plane set between the output part and an optical fiber to which the combined laser beam is to be coupled.

21. The method according to claim 18, wherein said aligning the optical synthesizing element includes adjusting a position of the optical synthesizing element such that an intensity coupled to a dummy fiber positioned so as to receive the combined laser beam emerging from the output part of the optical synthesizing element is maximized.

* * * * *